(12) United States Patent
Koelmel et al.

(10) Patent No.: US 8,388,853 B2
(45) Date of Patent: Mar. 5, 2013

(54) NON-CONTACT SUBSTRATE PROCESSING

(75) Inventors: Blake Koelmel, Mountain View, CA (US); Nyi O. Myo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 426 days.

(21) Appl. No.: 12/701,047

(22) Filed: Feb. 5, 2010

(65) Prior Publication Data
US 2010/0200545 A1    Aug. 12, 2010

Related U.S. Application Data

(60) Provisional application No. 61/151,647, filed on Feb. 11, 2009.

(51) Int. Cl.
*C23F 1/00* (2006.01)
(52) U.S. Cl. .......... 216/58; 156/345.51; 156/345.52; 156/345.54; 156/345.55; 118/728; 118/729; 118/730; 427/255.5
(58) Field of Classification Search .......... 216/58; 118/728–730; 156/345.51–345.55; 427/255.5
See application file for complete search history.

(56) References Cited

U.S. PATENT DOCUMENTS

| | | | |
|---|---|---|---|
| 3,982,627 A | 9/1976 | Isohata | |
| 4,681,776 A | 7/1987 | Bok | |
| 5,226,383 A | 7/1993 | Bhat | |
| 5,328,722 A * | 7/1994 | Ghanayem et al. | 427/250 |
| 5,710,407 A * | 1/1998 | Moore et al. | 219/405 |
| 5,761,023 A | 6/1998 | Lue et al. | |
| 6,005,226 A * | 12/1999 | Aschner et al. | 219/390 |
| 6,113,702 A | 9/2000 | Halpin et al. | |
| 6,343,183 B1 | 1/2002 | Halpin et al. | |
| 6,402,843 B1 | 6/2002 | Siniaguine et al. | |
| 6,454,866 B1 | 9/2002 | Halpin et al. | |
| 6,491,757 B2 | 12/2002 | Halpin et al. | |
| 6,692,576 B2 | 2/2004 | Halpin et al. | |
| 6,720,263 B2 | 4/2004 | Olgado et al. | |
| 6,839,507 B2 | 1/2005 | Adams et al. | |
| 2005/0091992 A1 | 5/2005 | Aggarwal et al. | |
| 2005/0126605 A1 | 6/2005 | Yassour et al. | |
| 2005/0145180 A1 | 7/2005 | Aggarwal et al. | |
| 2007/0175396 A1 | 8/2007 | Kasai et al. | |
| 2008/0276864 A1* | 11/2008 | Koelmel et al. | 118/500 |
| 2008/0280453 A1 | 11/2008 | Koelmel et al. | |

FOREIGN PATENT DOCUMENTS

| JP | 2008-214763 | 9/2008 |
|---|---|---|
| KR | 2008-0062340 | 7/2008 |

OTHER PUBLICATIONS

Tru-Si Technologies. "No Touch Handling", http://trusi.com/notouchhandling.html.
CoreFlow: "Thermal Processes", http://www.coreflow.com/page.asp?cat=71&type=2&lang=1.
CoreFlow: "Thermal Platforms", http://www.coreflow.com/page.asp?cat=140&type=2&lang=1.
CoreFlow: "From Technology to Solution", http://www.coreflow.com/page.asp?cat=79&type=2&lang=1.
CoreFlow: "Smart Nozzles", http://www.coreflow.com/page.asp?cat=113&type=2&lang=1.

(Continued)

*Primary Examiner* — Lan Vinh
*Assistant Examiner* — David Kaufman
(74) *Attorney, Agent, or Firm* — Patterson & Sheridan, LLP

(57) ABSTRACT

Embodiments of the present invention provide apparatus and methods for supporting, positioning or rotating a semiconductor substrate during processing. One embodiment of the present invention provides a method for processing a substrate comprising positioning the substrate on a substrate receiving surface of a susceptor, and rotating the susceptor and the substrate by delivering flow of fluid from one or more rotating ports.

6 Claims, 17 Drawing Sheets

OTHER PUBLICATIONS

CoreFlow: "Handling", http://aop.co.il/customers/core/page.asp?cat=66&lang=1&type=2.

CoreFlow: "XY(Z) Accurate Platforms", http://aop.co.il/customers/core/page.asp?cat=138&type=2&lang=1.

CoreFlow: "Coating", http://aop.co.il/customers/core/page.asp?cat=65&lang=1&type=2.

ASM International N.V.: Products—"Levitor", http://asm.com/index.php?option=com_content&task=view&id=13&Itemid=52.

International Search Report and Written Opinion dated Oct. 4, 2010 for International Application No. PCT/US2010/023392.

* cited by examiner

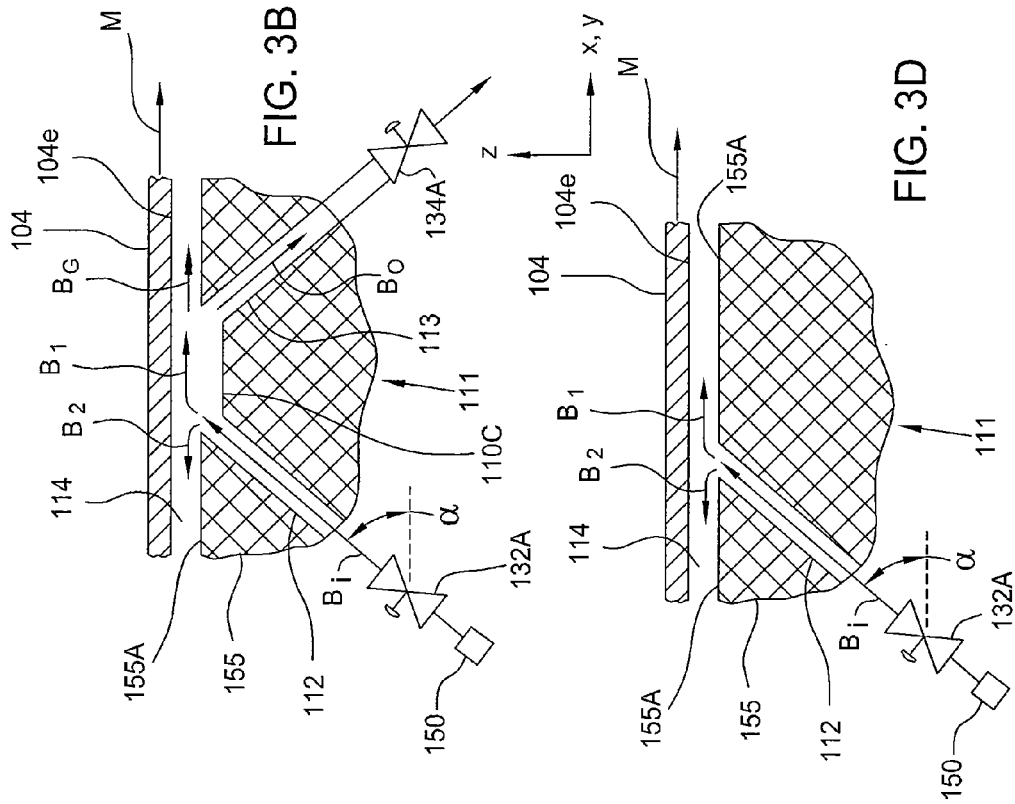
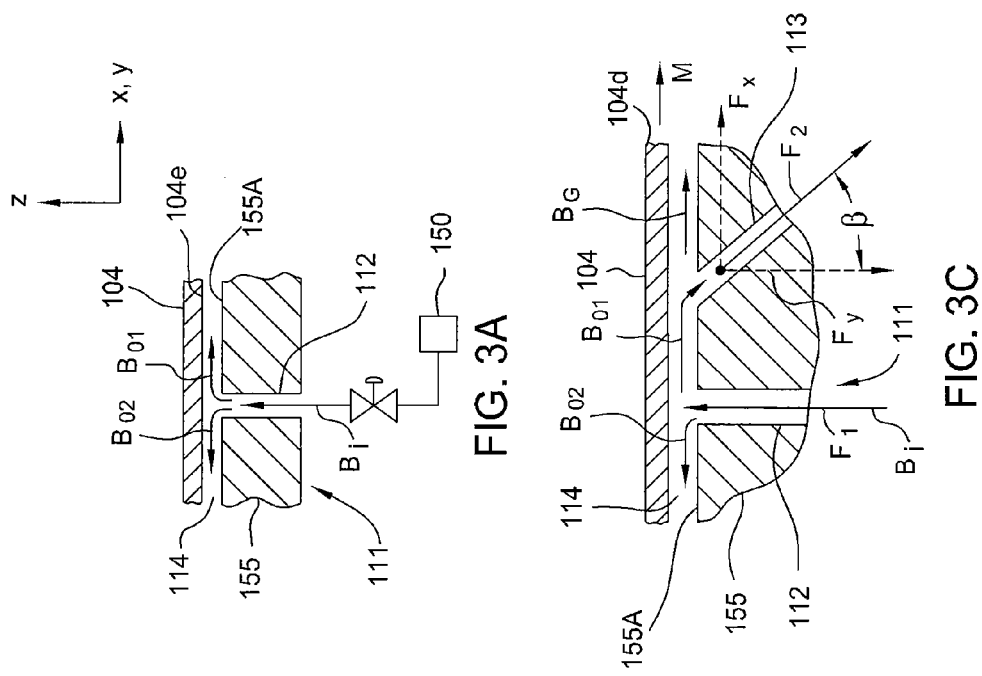

NON-CONTACT SUBSTRATE PROCESSING

CROSS-REFERENCE TO RELATED APPLICATIONS

This application claims benefit of U.S. Provisional Patent Application Ser. No. 61/151,647, filed Feb. 11, 2009, which is herein incorporated by reference.

BACKGROUND

1. Field of the Invention

The present invention relates generally to the field of semiconductor processing, and more specifically, to supporting, positioning or rotating a substrate during semiconductor device fabrication in a processing chamber.

2. Description of the Related Art

In the fabrication of integrated circuits and displays, semiconductor, dielectric, and electrically conducting materials are formed on a substrate, such as a silicon substrate or a glass substrate. The materials can be formed by chemical vapor deposition (CVD), atomic layer deposition (ALD), physical vapor deposition (PVD), ion implantation, plasma or thermal oxidation, epitaxial growth (EPI), and nitridation processes. Thereafter, the deposited materials can be etched to form features such as gates, vias, contact holes and interconnect lines. In a typical deposition or etch processes, the substrate is exposed to a plasma in a substrate processing chamber to deposit or etch material on the substrate surface. Other typical processes that may be performed on a substrate may include thermal processing techniques that may include rapid thermal processing (RTP), or laser annealing processes.

During processing, a substrate is typically held on a substrate support having a substrate receiving surface. The support can have an embedded electrode that serves as a plasma generating device during processing and/or it may also be charged to electrostatically hold the substrate. The support can also have a resistance heating element to heat the substrate during processing, and/or a water cooling system to cool the substrate or to cool the support.

One issue that arises is that as device sizes decrease the tolerance to variation across the substrate has become very low such that the alignment and positioning of a substrate relative to the substrate support, shadow ring, or other chamber components can have an affect on the uniformity of the process results achieved on the substrate.

In some cases, one or more regions in a process chamber may be unable to uniformly generate a plasma (e.g., PECVD, PVD, EPI), uniformly deliver heat to the substrate (e.g., RTP, PECVD, EPI), and/or have regions of non-uniform gas flow due to the position orientation of the gas inlet or exhaust in the processing chamber, which commonly creates the need to rotate the substrate to average out the non-uniformities seen in different areas of the processing region of the processing chamber.

Rotating the substrate is often a very expensive and complicated process to perform in a processing chamber that requires the substrate to be processed at sub-atmospheric pressures, to be processed at high temperatures and/or require one or more rotatable electrical connections to allow power to be delivered to one or more components in the substrate support (e.g., heater elements). The complexity and cost generally arises due to the need for high temperature rotational components (e.g., bearings) that are reliable and will not generate particles, precise and expensive motors, complex control systems, reliable rotating electrical connections, and reliable rotating vacuum seals.

Therefore, there is a need for an improved system adapted to support, position, and/or rotate a substrate during a substrate processing, which does not require direct contact with the substrate, is inexpensive to use and maintain, provides good process results, is reliable, and is easy to control.

SUMMARY

Embodiments of the present invention provide apparatus and methods for processing semiconductor substrates. Particularly, embodiments of the present invention provide apparatus and methods for supporting, positioning or rotating a semiconductor substrate during processing.

One embodiment of the present invention provides a method for processing a substrate comprising positioning the substrate on a substrate receiving surface of a susceptor, wherein the susceptor is disposed over a support assembly of a processing chamber, the support assembly comprises one or more supporting ports, one or more rotating ports, and each of the supporting ports and rotating ports is adopted to receive a fluid from a flow controller, raising the substrate to a processing position by delivering flow of fluid to the one or more supporting ports to float the susceptor and the substrate, and rotating the susceptor and the substrate by delivering flow of fluid to the one or more rotating ports.

Another embodiment of the present invention provides an apparatus for processing a substrate comprising a chamber body defining a processing volume, a first quartz window formed through the chamber body, wherein quartz window is configured to transmit radiant energy from a first external source to the processing volume, a susceptor having a substrate receiving surface configured to support a substrate, and one or more ports configured to float and rotate the susceptor by transmitting a flow of fluid towards a backside of the susceptor.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a cross-sectional view of a substrate support port in accordance with one embodiment of the present invention.

FIG. 3B is a cross-sectional view of a substrate support port in accordance with one embodiment of the present invention.

FIG. 3C is a cross-sectional view of a substrate support port in accordance with one embodiment of the present invention.

FIG. 3D is a cross-sectional view of a substrate support port in accordance with one embodiment of the present invention.

Figure 1A:
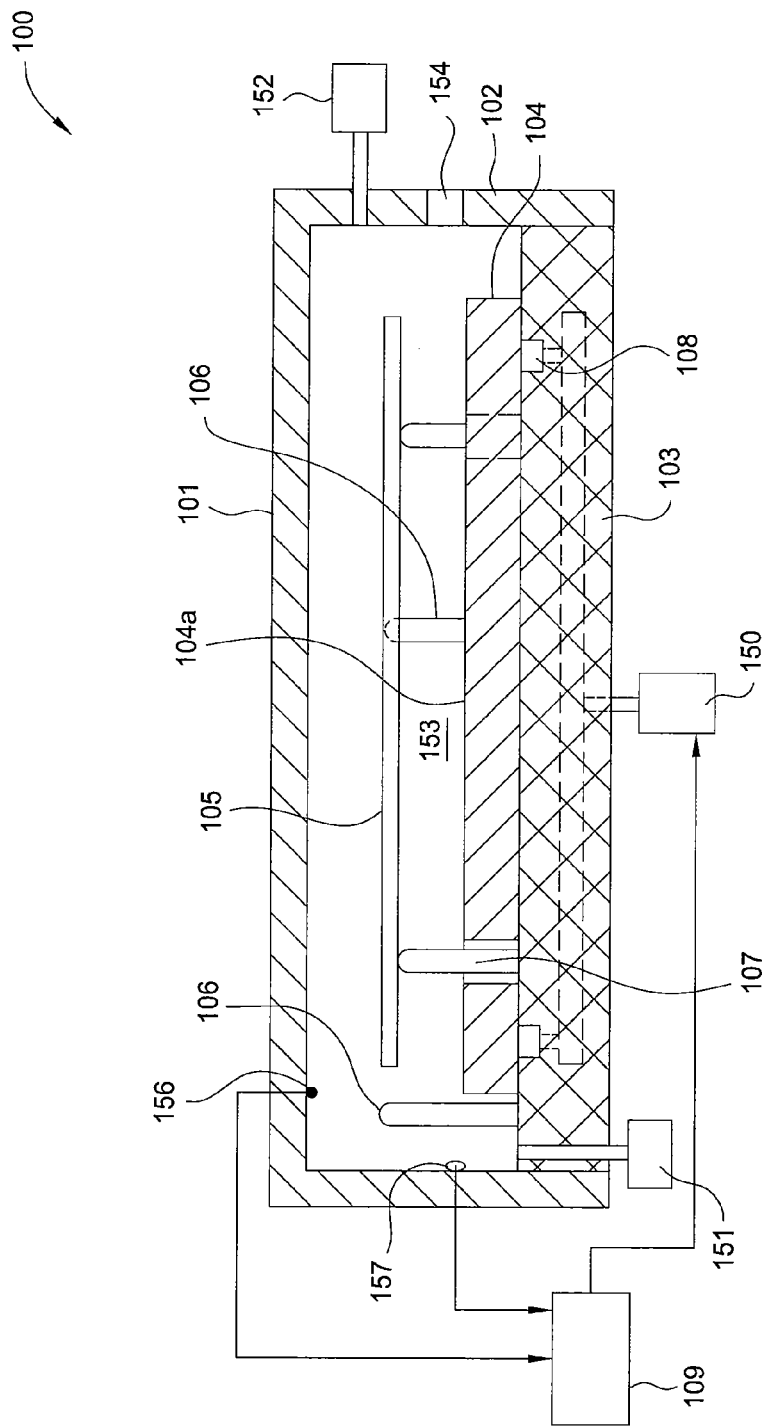
FIGS. 1A-1B schematically illustrate a processing chamber in accordance with one embodiment of the present invention.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

The present invention generally provides methods and apparatus for processing a substrate. One embodiment of the present invention provides a method for processing a substrate by positioning the substrate on a receiving surface of a susceptor and handling the susceptor using one or more ports to direct flow of fluid towards a backside of the susceptor. In one embodiment, handling the susceptor comprises raising and lowering the susceptor along with the substrate as well as rotating the susceptor. In one embodiment, the one or more ports are formed in a quartz window of a processing chamber, wherein the quartz window is configured to transmit radiant energy towards the backside of the susceptor.

Method and apparatus of the present invention allow a substrate being processed with limited contacts between chamber elements and the substrate, and at the same time improve heating uniformity across the substrate. By using flows of fluid to support and/or rotate the substrate during processing, embodiments of the present invention reduce complexity of substrate processing apparatus, thus reducing original and maintenance costs of the apparatus. By shielding the substrate from flows of motion control fluid, embodiments of the present invention improve heating uniformity across the substrate being processed.

Embodiments of the invention contemplate a method, apparatus and system that are used to support, position, and rotate a substrate during processing. Embodiments of the invention may also provide a method of controlling the transfer of heat between a substrate and substrate support positioned in a processing chamber. The apparatus and methods described herein remove the need for complex, costly and often unreliable components that would be required to accurately position and rotate a substrate during one or more processing steps, such as an rapid thermal processing (RTP) process, a chemical vapor deposition (CVD) process, a physical vapor deposition (PVD) process, atomic layer deposition (ALD) process, wet clean processes (e.g., Tempest™ process chamber available from Applied Materials Inc.), dry etching process, epitaxial growing process (EPI), and/or laser annealing process.

Substrates that may be processed using the methods, apparatus and system described herein may include, but are not limited to 200 mm, 300 mm or larger single crystal silicon (Si), multi-crystalline silicon, polycrystalline silicon, germanium (Ge), silicon carbide (SiC), glass, gallium arsenide (GaAs), cadmium telluride (CdTe), cadmium sulfide (CdS), copper indium gallium selenide (CIGS), copper indium selenide (CuInSe$_2$), gallilium indium phosphide (GaInP$_2$), as well as heterojunction cells, such as GaInP/GaAs/Ge or ZnSe/GaAs/Ge substrates. The substrates being processed may be circular, or any other desirable shape.

Figure 1B:
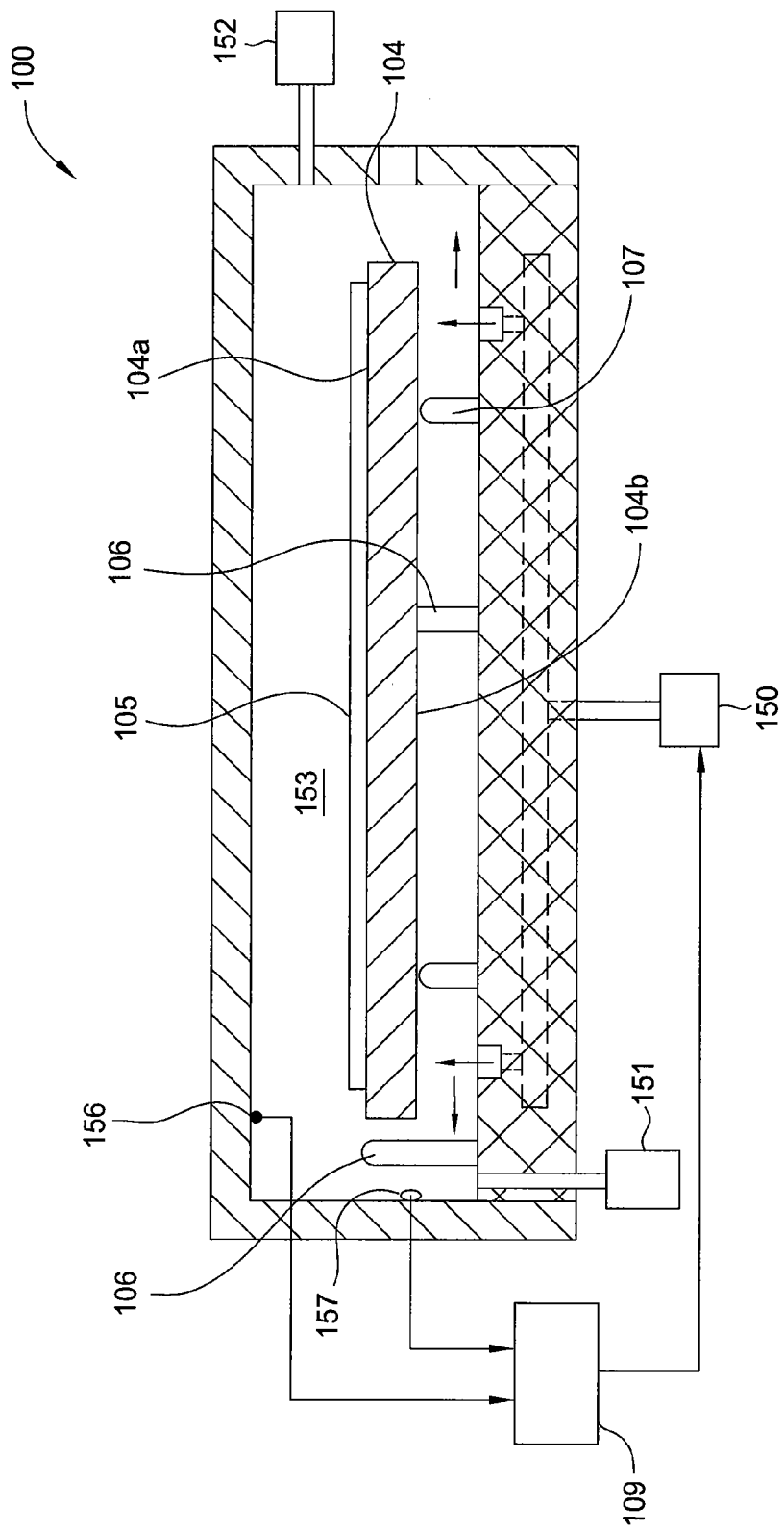

FIGS. 1A-1B schematically illustrate a processing chamber 100 in accordance with one embodiment of the present invention.

The processing chamber 100 comprises a chamber lid 101, chamber walls 102, and a chamber bottom 103. The chamber lid 101, chamber walls 102, and chamber bottom 103 define a processing volume 153. In one embodiment, a slit valve 154 is formed through the chamber walls 102. The slit valve 154 is configured to transfer substrates to and from the processing volume 153. In one embodiment, the processing chamber 100 further comprises a gas source 152 configured to provide one or more processing gases to the processing volume 153. The processing chamber 100 also comprises a vacuum pump 151 configured to pump the processing volume 153.

The processing chamber 100 further comprises a susceptor 104 disposed in the processing volume 153. The susceptor 104 has a substrate receiving surface 104a configured to receive a substrate 105 thereon.

One or more ports 108 are formed in the chamber bottom 103. The one or more ports 108 are connected to a fluid delivery system 150. In one embodiment, the one or more ports 108 comprise one or more supporting ports configured to elevate the susceptor 104 along with the substrate 105, and one or more rotating ports configured to rotate the susceptor 104 and the substrate 105 while the susceptor 104 is in an elevated position. Embodiments of the one or more ports 108 are further described below in FIGS. 2A and 2B.

In one embodiment, the one or more ports 108 are formed in a quartz window in the chamber bottom 103. The quartz window is configured to allow passage of radiant energy to the processing volume 153. Because the susceptor 104 faces the quartz window, the radiant energy passing from the quartz window heats the susceptor 104 directly. The substrate 104 is subsequently heated via the susceptor 104. The fluid flow from the one or more ports 108 may affect heating to the susceptor 104. However, the effect of the fluid flow on the heating of the substrate 105 is much reduced.

Therefore, by using the susceptor 104 in handling the substrate 105 with fluid flow, negative effects of fluid flow over uniform heating can be reduced. Additionally, by shielding the substrate from the fluid flow, the substrate is also shielded from particle contamination.

In one embodiment, the processing chamber 100 further comprises three or more substrate supporting pins 107 configured to receive and support the substrate 105. In one embodiment, the three or more substrate supporting pins 107 may be retractable when not supporting a substrate.

In one embodiment, the processing chamber 100 comprises a susceptor positioning system 106 configured to limit the susceptor 104 within a region, particularly when the susceptor 104 is lifted and rotated by the one or more ports 108.

In one embodiment, the processing chamber 100 further comprises sensors 156, 157 configured to detect positions and orientations of the susceptor 104. In one embodiment, the sensor 156 may be configured to align the susceptor 104 with the three or more substrate supporting pins 107 while the susceptor 104 rotates above the three or more substrate supporting pins 107. The sensor 156 can also provide signals about rotation speed of the susceptor 104. In one embodiment, the sensor 157 may be configured to detect whether the susceptor 104 reaches a desired elevation, and/or the location of the susceptor 104 in a horizontal plan, such as a X and a Y direction. In one embodiment, the sensor 157 may comprise one or more laser, electrical, or optical sensors.

The sensors 156, 157 may be connected to a controller 109. The controller 109 is further connected to the fluid delivery system 150. The controller 109 receives information from the sensors 156, 157 and obtains position and motion of the susceptor 104. The controller 109 can send control signals to the fluid delivery system 150, thus, controlling the one or more ports 108 to adjust position and motion of the susceptor 104 accordingly.

FIG. 1A depicts the processing chamber 100 in a substrate transferring position. The susceptor 104 rests on the one or more ports 108. The three or more substrate supporting pins 107 extends through the susceptor 104 forming a supporting surface for the substrate 105. The three or more substrate supporting pins 107 are in position to receive the substrate 105 from a substrate handler (not shown) delivering the substrate 105 through a slit valve 154 or to transfer the substrate 105 to the substrate handler. In one embodiment, the three or more substrate supporting pins 107 are retractable and are in an extended position.

FIG. 1B depicts the processing chamber 100 in a substrate processing position. In one embodiment, the one or ports 108 provide flow of fluid to lift the susceptor 104 from the resting position, and the lifted susceptor 104 picks up the substrate 105 from the three or more substrate supporting pins 107. In another embodiment, the three or more substrate supporting pins 107 retracts to below the susceptor 104 and the substrate 105 rests on a receiving surface 104a of the susceptor 104. In another embodiment, the substrate 105 is transferred from the three or more substrate supporting pins 107 to the receiving surface 104a of the susceptor 104 by lifting the susceptor 104, retracting the three of more substrate supporting pins 107, or the combination of the two.

When the susceptor 104 is lifted from the chamber bottom 103 and cleared from the three or more substrate supporting pins 107, the one or more ports 108 provides additional fluid flow to rotate the susceptor 104 along with the substrate 105. In one embodiment, the elevation of the susceptor 104 may be determined by a sensor signal from the sensor 157. In one embodiment, the substrate 105 is rotated at an elevation different from the elevation of the slit valve 154 to reduce processing gas non-uniform distribution due to the non symmetry in the processing volume 153 caused by the slit valve 154.

The one or more ports 108 provide fluid flows to position the substrate 105 in a processing position by lifting the susceptor 104 to a predetermined position. Additionally, the susceptor 104 and the substrate 105 also rotate during processing. During rotation, the susceptor positioning system 106 may be employed to prevent the susceptor 104 from drifting away.

Upon conclusion of processing, rotation of the susceptor 104 and the substrate 105 stops and the susceptor 104 is lowered back to the resting position after aligning the susceptor 104 with the three or more substrate supporting pins 107. In one embodiment, the alignment may be performed by rotating the susceptor 104 to position a marker on the susceptor 104 in a certain position according to signals form the sensor 156.

The processed substrate 105 is again supported by the three or more substrate supporting pins 107 by lowering of the susceptor 104, extending of the three or more substrate supporting pins 107, or combination of lowering of the susceptor 104 and extension of the three or more substrate supporting pins 107. The processing chamber 100 returns to the substrate transferring position shown in FIG. 1A.

Figure 2A:
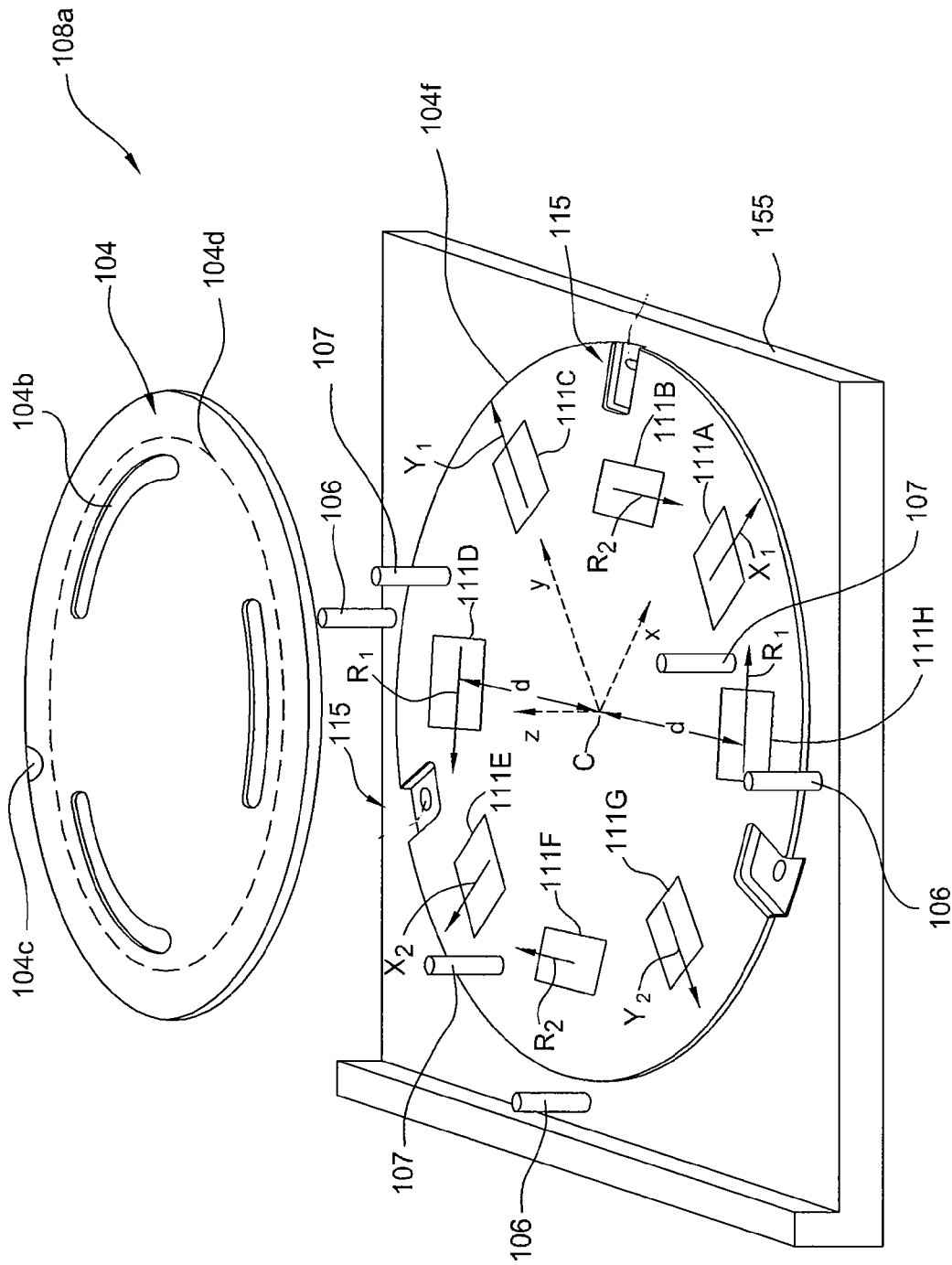
FIG. 2A schematically illustrates a substrate handling assembly in accordance with one embodiment of the present invention.

FIG. 2A schematically illustrates a substrate handling assembly 108a in accordance with one embodiment of the present invention. The substrate handling assembly 108a may be used in the processing chamber 100 of FIG. 1A. The substrate handling assembly 108a comprises a supporting body 155 wherein ports for fluid flow are formed, and a susceptor 104 configured to support a substrate thereon. In one embodiment, the supporting body 155 may be part of a chamber body, such as the chamber bottom 103 of the processing chamber 100. In another embodiment, the supporting body 155 may be a separate structure disposed within a processing chamber. The supporting body 155 has a substantially planar top surface 155A configured to support the susceptor 104. In one embodiment, the susceptor 104 may be positioned within a circular region 104f of the top surface 155A.

The susceptor 104 is disposed over a top surface 155A of the supporting body 155 and may be lifted and rotated by fluid flow from the supporting body 155. The substrate handling assembly 108a further comprises three or more substrate supporting pins 107 extending from the top surface 155A of the supporting body and configured to receive and transfer a substrate. The susceptor 104 may have openings 104b formed therethrough to allow extension of the substrate supporting pins 107. In one embodiment, the susceptor 104 may be a circular disk.

The substrate handling assembly 108a further comprises a susceptor positioning system 106 extending from the support body 155 and configured to restrain the susceptor 104 within a desired region. In one embodiment, the susceptor positioning system 106 comprises three retaining pins extending upward from the top surface 155A of the support body 155.

In one embodiment, the support body 155 has eight ports 111A-111H formed therein and opening at the top surface 155A. In one embodiment, the ports 111A-111H has oriented inject apertures 112 and/or exhaust apertures 113 that are used to impart motion to objects, such as the susceptor 104, positioned thereon.

As shown in FIG. 2A, the predominant flow vectors $X_1, Y_1, X_2,$ and $Y_2$ for the ports 111A, 111C, 111E, and 111G, respectively, are adapted to move susceptor 104 in either the X or Y-directions by delivery of a fluid through the features contained in each of the ports. For example, the port 111A is adapted to move the susceptor 104 in a +X-direction by delivering fluid in the predominant flow vector $X_1$, the port 111C is adapted to move the susceptor 104 in a +Y-direction by delivering fluid in the predominant flow vector $Y_1$, the port 111E is adapted to move the susceptor 104 in a −X-direction by delivering fluid in the predominant flow vector $X_2$, and the port 111G is adapted to move the susceptor 104 in a −Y-direction by delivering fluid in the predominant flow vector $Y_2$.

In one embodiment, as shown in FIG. 2A, the predominant flow direction vectors for ports 111A, 111C, 111E, and 111G each pass though a common point "C", such as substantially the center of the substrate handling assembly 108a, thus allowing the susceptor 104 and a substrate positioned thereon to be positioned in the X and Y-directions without tending to rotate the susceptor 104.

In one embodiment, the ports 111B, 111D, 111F, and 111H contain features that are adapted to rotate the susceptor 104 in either in a clockwise or counter-clockwise direction due to the orientation of the features contained in each of the ports creating the force vectors $R_2$ and $R_1$, respectively. In this configuration each of the ports 111B, 111D, 111F, and 111H have a predominant flow direction that is normal to the radius of the susceptor 104. Therefore, to cause the susceptor 104 to rotate in a clockwise direction, flow of fluid is delivered to the features in the ports 111B and 111F, and to cause the susceptor 104 to rotate in a counter-clockwise direction, flow of fluid is delivered to the features in the ports 111D and 111H.

FIGS. 3B-3C schematic illustrate embodiments of a port 111 that can be used as the ports 111A-111H.

FIG. 3B is a side cross-sectional view of a port 111 that is oriented at an angle α to the lower surface 104e of the susceptor 104 so that the susceptor 104 can be supported and moved as needed. In one embodiment, the port 111 contains one or more apertures 112 and one or more of exhaust apertures 113 that positioned in a recess 110C on the top surface 155A of the supporting body 155. The one or more inject apertures 112 and/or exhaust apertures 113 can help increase the coupling of fluid delivered to the substrate by the port 111 and thus help to improve the control of the movement of the susceptor 104.

In one embodiment, the port 111 has one or more inject apertures 112 formed therein. Each inject aperture 112 has a converging section and diverging section to allow for the creation of supersonic flow when the pressure drop is greater than the critical point. It is believed that by delivering a gas at supersonic velocities to the lower surface 104e of the susceptor 104, motion of the susceptor 104 can be created by the friction caused by the flow of gas towards a low pressure region created by the supersonic flow delivered by a port. Therefore, the motion of the susceptor 104 can be controlled by delivering supersonic flows from one or more strategically placed ports.

In one embodiment, it may also be desirable to use ports that are able to deliver supersonic flows and ports that are able to deliver subsonic flows to move and/or position the susceptor 104. An advantage of delivering a supersonic flow through a port is that it allows one to induce a directional flow (i.e., towards the point of low pressure) without the need to machine an angled aperture in the supporting body 155. Forming an angled aperture in the substrate support can be difficult to achieve in supports bodies that are made of a ceramic material.

The one or more exhaust apertures 113 are configured to capture at least a portion of the inlet flow $B_i$ injected by the inject apertures 112. This configuration can allow the flow of fluid delivered by each port 111 to be self contained if desired, thus avoiding the case where the flow from one port 111 on the substrate handling assembly 108a interacts with the flow from other ports 111 formed a distance there from. In one case it is desirable to restrict the flow of fluid through the exhaust apertures 113 so that a portion of the inlet flow $B_i$ exits the port 111 through the exhaust aperture 113 and a portion of the inlet flow $B_i$ flows into the gap 114 formed between the lower surface $W_1$ and the top surface 155A of the supporting body 155 (i.e., gap flow $B_G$).

In another embodiment, it is desirable to selectively inhibit the injected inlet flow $B_i$ from exiting through the exhaust aperture 113 at different times during the substrate processing step(s) by use of a controllable exhaust valve 134A. The controllable exhaust valve 134A may be connected to an exhaust pump or similar type exhaust system that is able to reduce the pressure and increase the flow in the exhaust aperture 113. Closing the exhaust aperture 113 will cause the injected fluid to flow within the gap 114 formed between the lower surface 104e and the top surface 155A of the supporting body 155 (i.e., gap flow direction $B_G$) and thus improve the support of the susceptor 104.

FIG. 3C is a side cross-sectional view of a port 111 in accordance with another embodiment of the present invention. The port 111 has an inject aperture 112 that is oriented at an angle that is substantially normal to the lower surface 104e of the susceptor 104 and an exhaust aperture 113 that is oriented at an angle β relative to the lower surface 104e. In this configuration a force $F_1$ created by the inlet flow $B_i$ is used to primarily support the susceptor 104, while the angled orientation of the exhaust aperture 113 is used to provide a force $F_x$, which is a component of the force $F_2$ generated from the outlet flow in the flow direction $B_{O1}$, that is applied to the susceptor 104. The force $F_x$ is used to move or position the susceptor 104 in a desired direction M.

Therefore, by providing multiple selectively controllable exhaust apertures that have been distributed in various desired directions around the supporting body 155 and/or having desired angles (e.g., angle β) the movement of the susceptor 104 can be easily controlled. In this configuration the movement can be somewhat decoupled from the inlet flow $B_i$'s flow properties. Also, in this configuration the inlet flow $B_i$ tends to reduce the risk of the lower surface 104e of the susceptor 104 contacting the supporting body 155 to minimize the creation of particles or damage to the lower surface 104e of the susceptor 104.

One skilled in the art would appreciate that if a port has a predominant flow direction that does not pass through the center of gravity of the susceptor 104, a rotational component and a translational component will both be imparted to the susceptor 104. Therefore, to obtain a purely rotational motion the sum of the forces in the X-direction and Y-direction by the ports need to equal zero, while leaving a torque created by the application of a force at a distance from center of gravity of the susceptor 104. For example, referring to FIG. 2A, if ports 111D and 111H each deliver a force vector $R_1$ in opposite directions at a distance "d" from the center of the susceptor 104, the magnitude of the counter-clockwise torque applied to the susceptor 104 would be equal to about $2(R_1 \times d)$. Also, since the center of the susceptor 104 will generally move relative to the ports active translational and rotational corrections will need to be made by a controller, such as the controller 109, assure that the susceptor 104 remains in a desired orientation and/or position in the processing chamber if desired.

In one embodiment, as shown in FIG. 2A, each of the ports 111A-111H are oriented so that the predominant flow direction is towards the edge of a circular region 104f corresponding to the susceptor 104 while the susceptor 104 rests on the supporting body 155. In one embodiment, the susceptor positioning system 106 is configured to assure that the susceptor 104 is positioned over the circular region 104f.

In orienting the predominant flow direction towards the edge of the circular region 104f, generally, the radial component of the predominant flow direction can be equal to zero (i.e., perpendicular to the radius) or directed away from the center of the susceptor 104 when it is generally centered over the supporting body 155. It has been found that by orienting the predominant flow direction towards the edge of the circular region 104f, or away from the center of the circular region 104f, helps to reduce the interaction between adjacent ports caused by the overlapping flows delivered by each port. In one embodiment, it is desirable to stagger the position of adjacent ports to reduce the interaction between ports.

As shown in FIG. 2A, the substrate handling assembly 108a also contains a plurality of cut-outs 115 formed in the supporting body 155. The plurality of cut-outs 115 are used in conjunction with sensing components, such as the sensors 156, 157 to actively sense the position of a susceptor 104 positioned over the supporting body 155. Flows from ports 111A-111G can be adjusted to actively support, position and/or rotate the susceptor 104 during processing.

In one embodiment, the flow characteristics (e.g., pressure, velocity) from each of the ports 111A-111G are separately controlled by use of the components found in a fluid delivery system and a controller, such as the fluid delivery system 150 and the controller 109 of FIG. 1A.

It has been found that the susceptor 104 along with a substrate can be easily rotated to speeds above 1000 rpm with a positional accuracy of less than about 0.2 mm. In one embodiment, the susceptor is rotated at a speed between about 1 rpm and about 3000 rpm. The rotation speed may be or adjusted during one or more of the processing steps performed on a substrate on the susceptor 104 in a processing chamber.

To prevent the supporting/rotating fluid flow from disturbing and mixing with the processing gas, it is desirable to have slow flowing supporting/rotating fluid flow, thus, a slow rotating rate. For example, when the substrate is processed under a low pressure environment, such as during a low pressure CVD, the flow rate of processing gases are generally slow. On the other hand, it may be desirable to have a higher rotating rate for improved process uniformity during processes where the processing gas flow is less sensitive to mixing with the supporting flow. In one embodiment, during a low pressure process, the rotation rate may be low as a result of maintaining the supporting flow at a low level so that a vacuum system of a processing chamber can maintain a low pressure required by the process recipe. In one embodiment, the susceptor may be rotated between about 5 rpm to about 10 rpm during a CVD process, such as an epitaxial deposition. In one embodiment, the susceptor may be rotated at about 240 rpm during a rapid thermal processing.

Figure 2B:
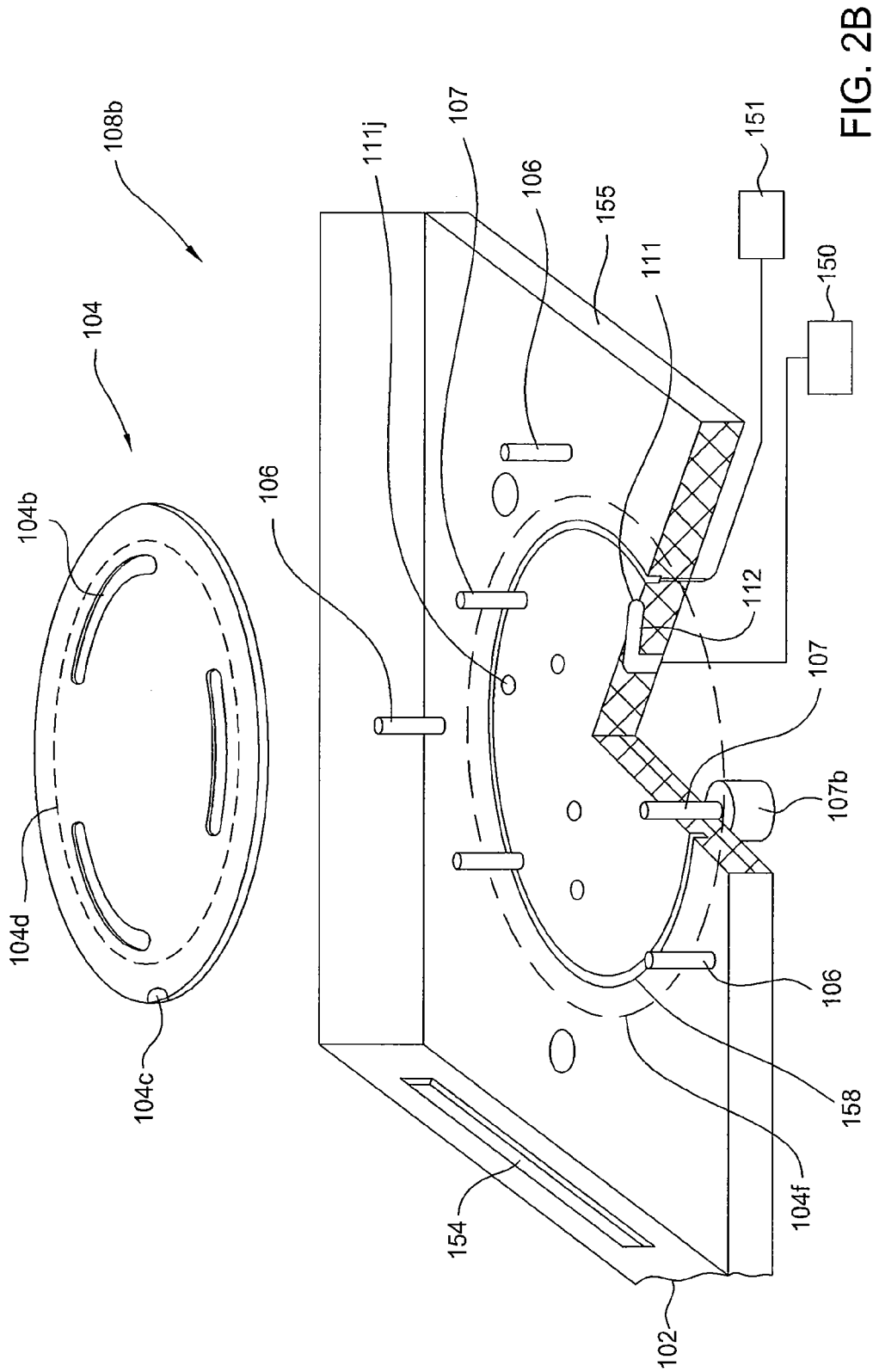
FIG. 2B schematically illustrates a substrate handling assembly in accordance with another embodiment of the present invention.

FIG. 2B schematically illustrates a substrate handling assembly 108b in accordance with another embodiment of the present invention. The substrate handling assembly 108b may be used in the processing chamber 100 of FIG. 1A. The substrate handling assembly 108b comprises a supporting body 155 wherein a plurality of ports 111j for fluid flow are formed, and a susceptor 104 configured to support a substrate thereon. In one embodiment, the supporting body 155 may be part of a chamber body, such as the chamber bottom 103 of the processing chamber 100. In another embodiment, the supporting body 155 may be a separate structure disposed within a processing chamber. The supporting body 155 has a substantially planar top surface 155A configured to support the susceptor 104. In one embodiment, the susceptor 104 may be positioned within a circular region 104f of the top surface 155A.

Each of the plurality ports 111j has an inject apertures 112 that are used to channel the fluid delivered from the fluid delivery system 150 and impart motion to the susceptor 104 and a substrate (not shown for clarity) that is positioned thereon. In general, each port 111j may be in any desired orientation. In one embodiment, as shown in FIG. 2B, a single aperture 112 is adapted to provide a fluid to the lower surface 104e of the susceptor 104 in an orientation that is set by the orientation of the slanted aperture.

Apertures 112 may have a diameter of between about 0.001 inches (0.025 mm) and about 0.063 inches (1.6 mm). In one embodiment, the apertures 112 have a diameter between about 0.001 inches and about 0.032 inches. The apertures may be slanted in relation to the top surface 155A of the supporting body 155 at an angle between about 10° and about 80°, preferably between about 30° and 60°.

In one embodiment, an isolation feature 158 is used to prevent the fluid delivered by the ports from making its way into a processing region of a processing chamber. In one embodiment, the isolation feature 158 is a trench structure formed in the supporting body 155 and connected to a vacuum pump 151. It is generally desirable to position the ports 111j near the middle of the radius of the circular region 104f to reduce the chance of the fluid leaving the apertures 112 from making its way into the processing region. In one example, where a 300 mm semiconductor substrate is being processed, the ports 111j are positioned between about 25 mm and about 100 mm from the center of the circular region 104f configured to support the susceptor 104.

FIGS. 3A and 3D schematic illustrate embodiments of a port 111 that can be used as the ports 111j.

As shown in FIG. 3A, the port 111 contains an inject aperture 112 which is oriented in a substantially normal orientation to the lower surface 104e of the susceptor 104. In this configuration the inlet flow $B_i$ passing through the inject aperture 112 strikes the lower surface 104e of the susceptor 104 causing the fluid to flow in various directions, such as directions $B_{O1}$, $B_{O2}$. When the flow and/or pressure of the inlet flow $B_i$ delivered from the fluid delivery system 150 through the inject aperture 112 is high enough a gap 114 is formed between the susceptor 104 and the support body 155. In one embodiment, a valve 132A may be connected between the fluid delivery system 150 and the inject aperture 112. Due to the perpendicular orientation of the inject aperture 112 to the lower surface 104e the inlet flow $B_i$ will tend to support the susceptor 104 and move the susceptor 104 in only a vertical direction (i.e., Z-direction).

FIG. 3D is a side cross-sectional view of a port 111 that is oriented at an angle α to the lower surface 104e of the susceptor 104 so that the susceptor 104 can be supported and moved as needed. In this configuration no extra machining steps are required to form the top surface 155A, thus reducing the cost and complexity of the supporting body 155. As discussed above, the inlet fluid flow is oriented at an angle α to the lower surface 104e of the susceptor 104 so that the susceptor 104 can be supported and moved as needed by the creation of a predominant flow vector.

Embodiments of ports 111 in FIGS. 3A-3D can be used in combination to achieve desired control.

Figure 2C:
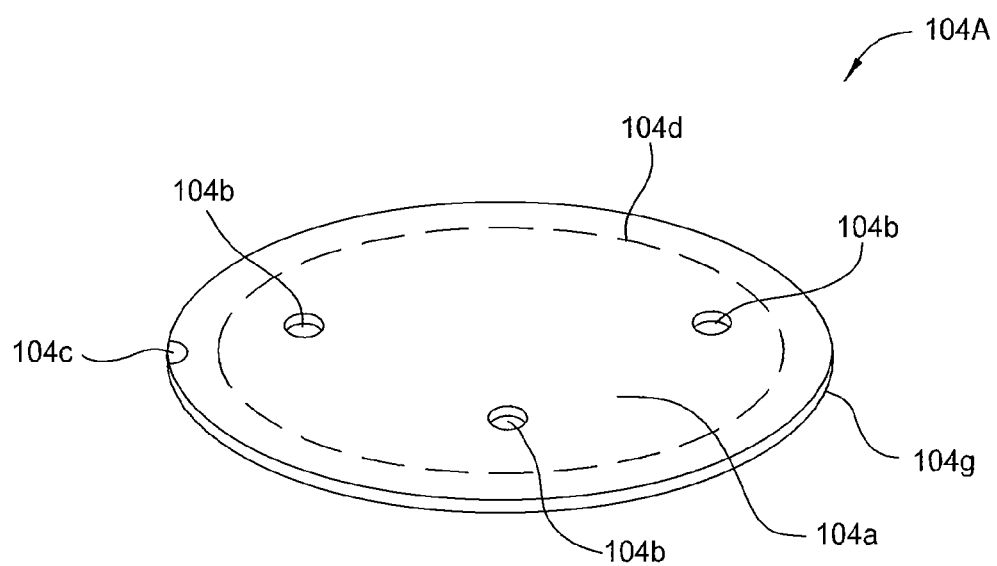
FIG. 2C schematically illustrates a susceptor in accordance with one embodiment of the present invention.

FIG. 2C schematically illustrates a susceptor 104A in accordance with one embodiment of the present invention. The susceptor 104A has a substantially circular disk shaped body 104g. A receiving surface 104a is configured to receive and support a substrate thereon. The receiving surface 104a is generally slightly larger than a substrate supported thereon. Circle 104d illustrates an area configured to receive a substrate on the receiving surface 104a. The circular disk shaped body 104g may be formed from materials that are chemically compatible or inert with a processing chemistry, and are with desirable thermal conductivities. In one embodiment, the circular disk shaped body 104g may be formed from silicon carbide, graphite, quartz, sapphire, silicon coated quartz, silicon carbide coated quartz, silicon coated graphite, silicon carbide coated graphite, or other suitable material.

Three or more openings 104b may be formed through the circular disk shaped body 104g. The openings 104b are configured to allow substrate supporting pins, such as substrate supporting pins 107, extending through while transferring a substrate between the susceptor 104A and the substrate supporting pins. To allow rotation of the susceptor 104A during processing, the substrate supporting pins retrieve from the openings 104b after the substrate is picked up by the susceptor 104A. To return the substrate back to the substrate supporting pins after processing, an alignment is needed to align the substrate supporting pins with the openings 104b.

In one embodiment, one or more markers 104c may be formed on the circular disk shaped body 104g to allow tracking of the orientation of the susceptor 104A during rotation. The marker 104c may be detected by a sensor, such as the sensor 156 in the processing chamber 100. In one embodiment, the marker 104c may be a notch formed near an edge of the circular disk shaped body 104g. In another embodiment, the marker 104c may be optical emitter or reflector detectable by optical sensors. The marker 104c can also be used to detect other characteristics of the susceptor 104A, such as rotational speed, elevation, leveling, and others.

Figure 2D:
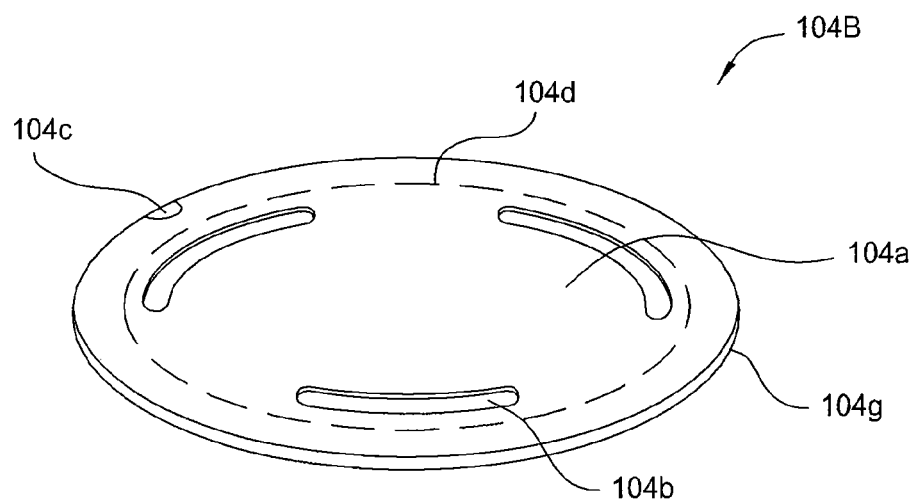
FIG. 2D schematically illustrates a susceptor in accordance with another embodiment of the present invention.

FIG. 2D schematically illustrates a susceptor 104B in accordance with another embodiment of the present invention. The susceptor 104B shown in FIG. 2D is similar to the embodiment shown in FIG. 2C except the openings 104a are elongated to allow increased tolerance in alignment with supporting pins.

Figure 2E:
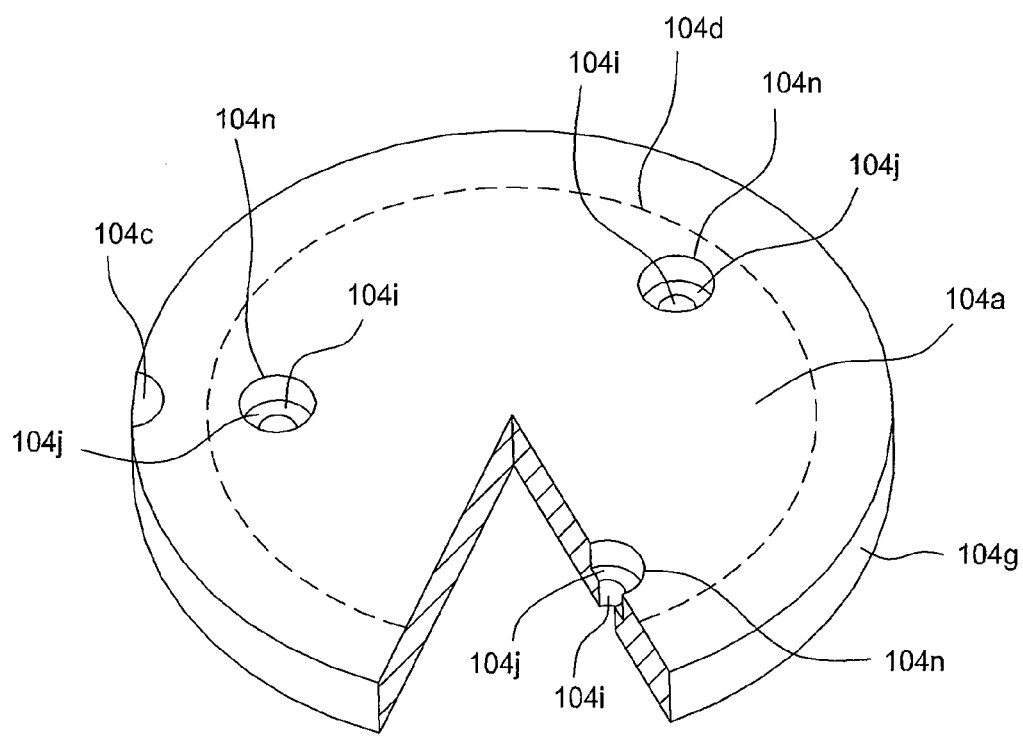
FIG. 2E schematically illustrates a susceptor in accordance with another embodiment of the present invention.

FIG. 2E schematically illustrates a susceptor 104C in accordance with another embodiment of the present invention. The susceptor 104C has a substantially circular disk shaped body 104g. A receiving surface 104a is configured to receive and support a substrate thereon. The receiving surface 104a is generally slightly larger than a substrate supported thereon. Circle 104d illustrates an area configured to receive a substrate on the receiving surface 104a. The circular disk shaped body 104g may be formed from materials that are chemically compatible or inert with a processing chemistry, and are with desirable thermal conductivities. In one embodiment, the circular disk shaped body 104g may be formed from silicon carbide, graphite, quartz, sapphire, silicon coated quartz, silicon carbide coated quartz, silicon coated graphite, silicon carbide coated graphite, or other suitable material.

Three or more recesses 104n may be formed on the receiving surface 104a. Each recess 104n is configured to retain and support a substrate supporting pin therein. Each recess 104n has a bottom surface 104j configured to support a substrate supporting pin during processing. An opening 104i is formed in the bottom surface 104j through the circular disk shaped body 104g. The opening 104i allows the substrate supporting pin to move relatively to the susceptor 104C.

In one embodiment, the susceptor 104C has a mark 104c configured to allow alignment of the susceptor 104C within the processing chamber. For example, a sensor may be used to track the marker 104c during rotation and a controller may position the susceptor 104C in an orientation such that a substrate handler will not collide with the substrate supporting pins extended from the susceptor 104C.

Figure 2F:
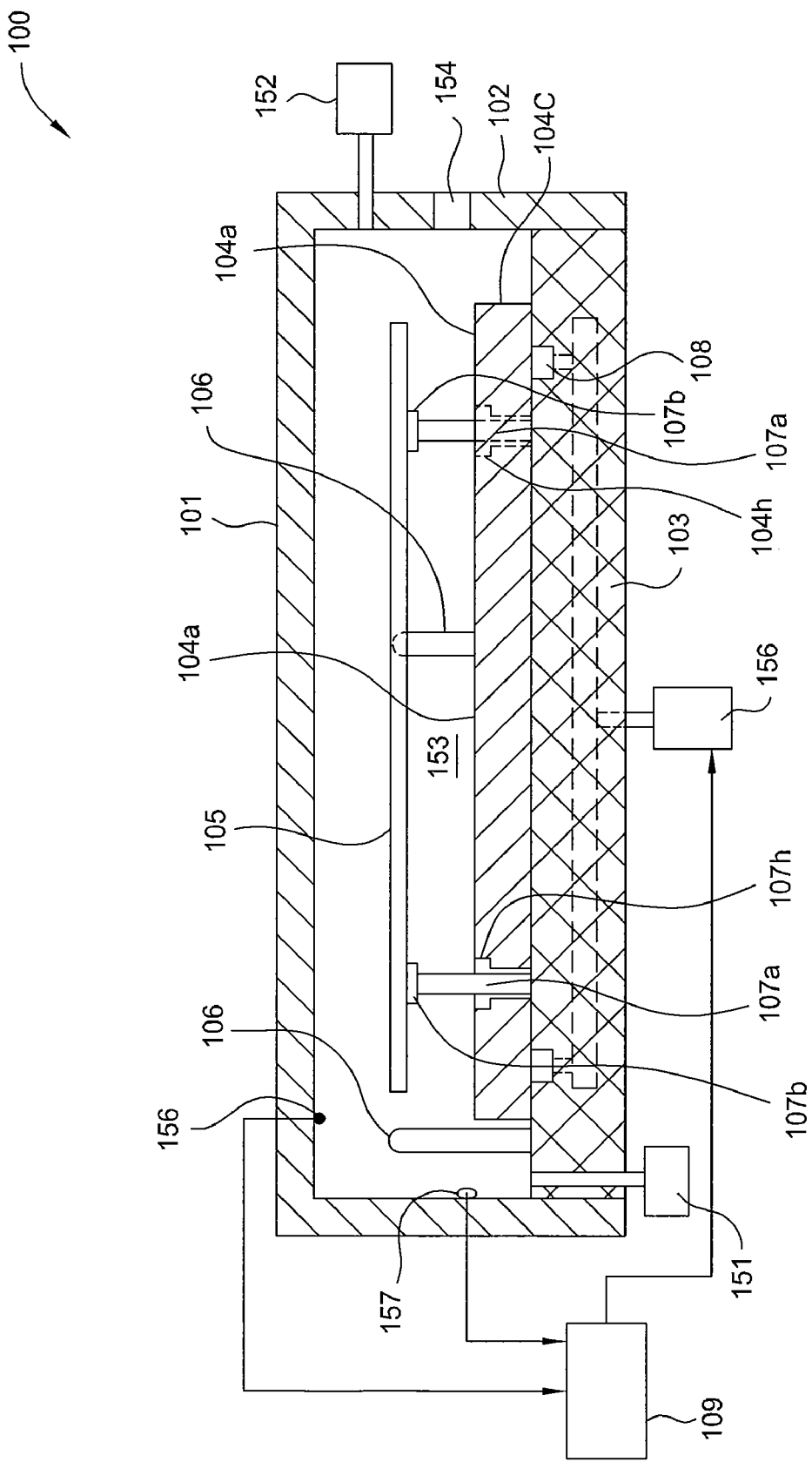
FIG. 2F schematically illustrates the susceptor of FIG. 2E in a substrate exchange position.
Figure 2G:
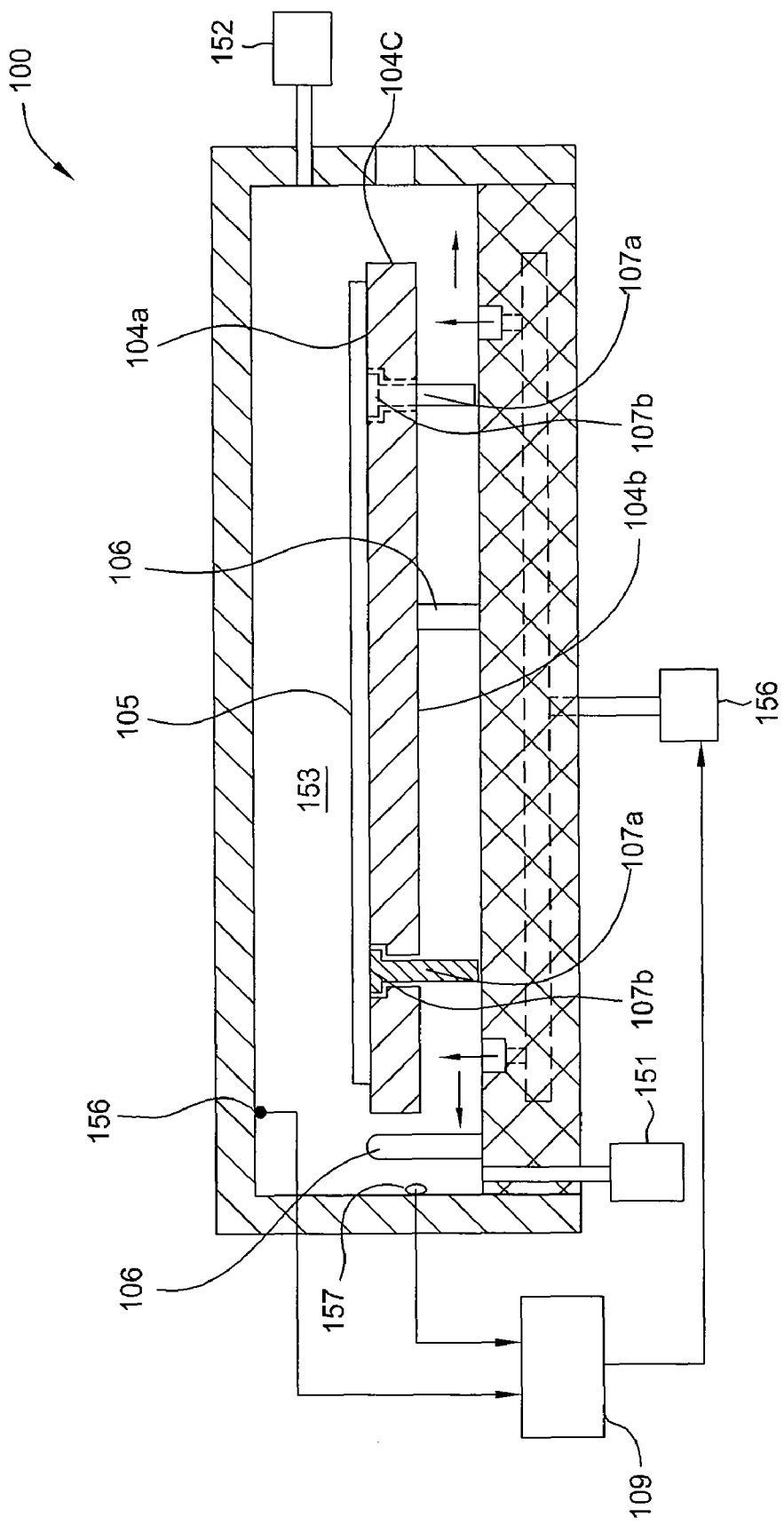
FIG. 2G schematically illustrates the susceptor of FIG. 2E in a processing position.

FIG. 2F schematically illustrates the susceptor 104C of FIG. 2E in a substrate exchange position. FIG. 2G schematically illustrates the susceptor 104C of FIG. 2E in a processing position. Three or more substrate supporting pins 107a are disposed in the three or more recesses 104n. Each substrate supporting pin 107a has a head 107b which allows the substrate supporting pin 107a to rest on the bottom surface 104j of the recess 104n when the susceptor 104C is raised. As shown in FIG. 2G, the three or more substrate supporting pins 107a remain in the susceptor 104C while the susceptor 104C is raised and/or rotated by the one or more ports 108. This configuration has several advantages. First, the delicate alignment between the susceptor 104C and the substrate supporting pins 107a is avoid when the substrate supporting pins 107a remain in the recesses 104n all the time. Second, the head 107b of the substrate supporting pin 107a "plugs" the recess 104n during processing, therefore, improving thermal uniformity of the substrate supporting surface 104a.

As shown in FIG. 2G, the substrate supporting pins 107a drop in the recesses 107h and remain in the susceptor 104C during processing. The substrate supporting pins 107a move relative to the susceptor 104C such that the substrate supporting pins 107a raise above the substrate supporting surface 104a of the susceptor 104C, therefore, lifting the substrate 105 from the susceptor 104C. A substrate handler, such as a robot, may then reach between the substrate 105 and the susceptor 104C to pickup the substrate 105 from the substrate supporting pins 107a. Similarly, the robot can drop off a new substrate onto the substrate supporting pins 107a. The relative motion of the substrate supporting pins 107a and the susceptor 104C may be achieved by moving the susceptor 104C vertically in the chamber, using a separate mechanism to raise or lower the substrate supporting pins 107a, or the combination of motions of the susceptor 104C and the substrate supporting pins 107a.

Figure 4A:
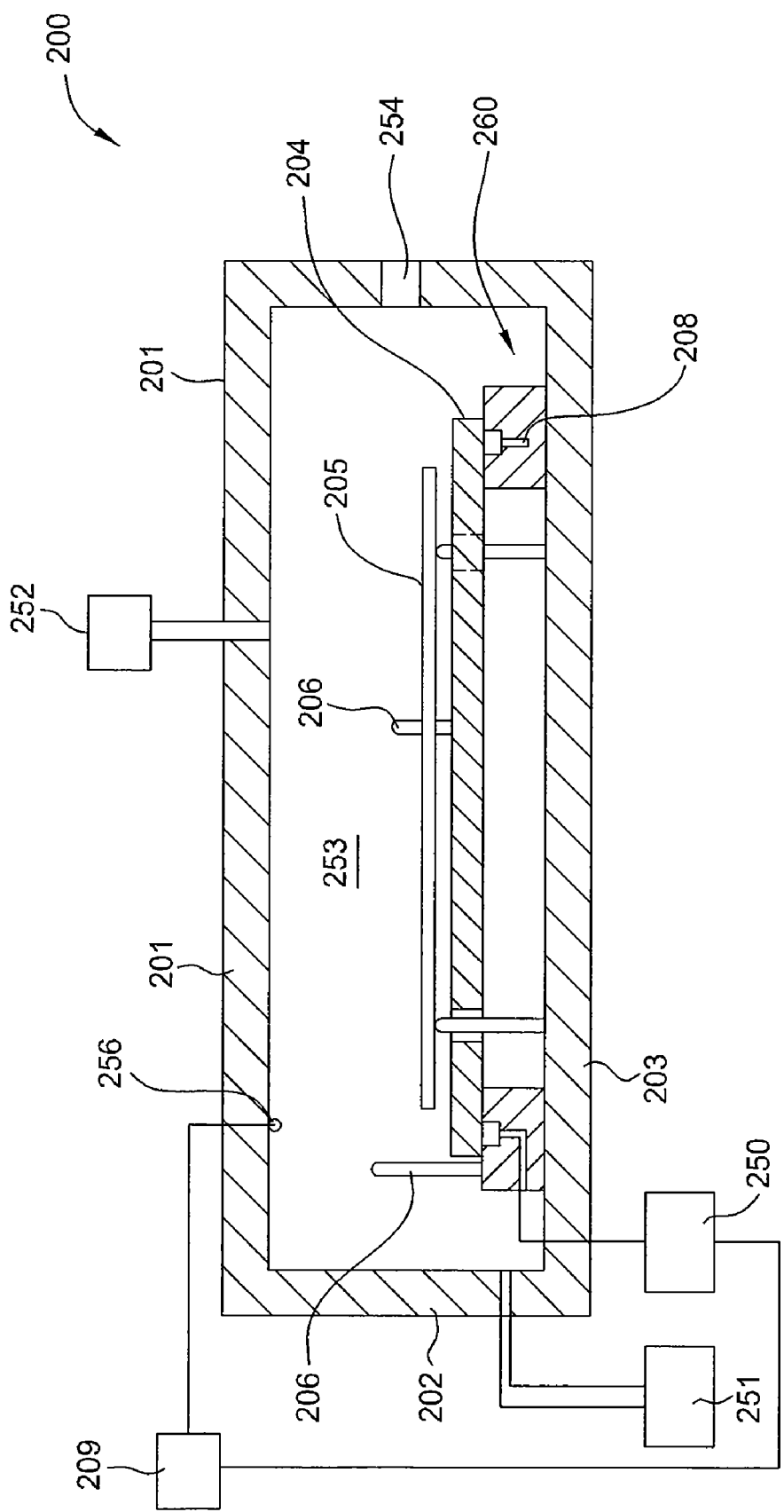
FIG. 4A-4C schematically illustrate a processing chamber in accordance with another embodiment of the present invention.
Figure 4B:
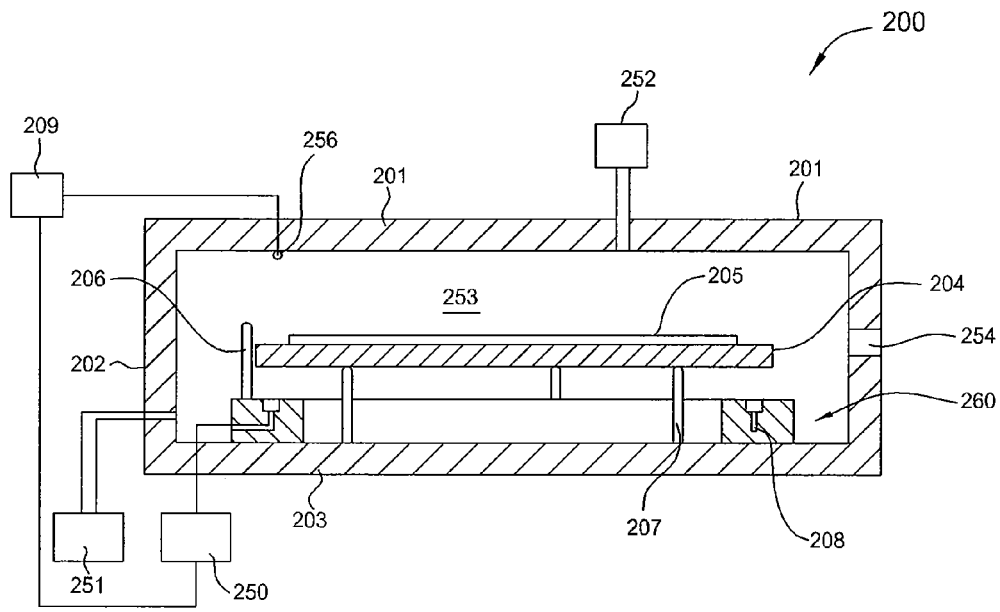
Figure 4C:
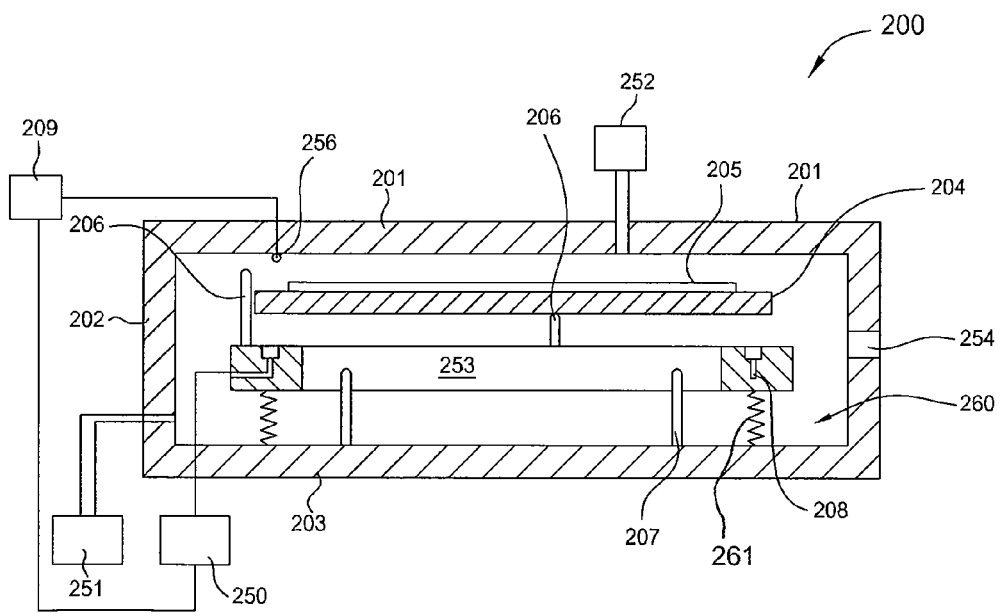

FIG. 4A-4C schematically illustrate a processing chamber 200 in accordance with another embodiment of the present invention. The processing chamber 200 comprises a susceptor support 260 movably disposed in a processing volume 253. In one embodiment, the susceptor 260 can move vertically in the processing volume 253 providing extra range of mobility to a susceptor 204, and additional process flexibility.

The processing chamber 200 comprises a chamber lid 201, chamber walls 202, and a chamber bottom 203. The chamber lid 201, chamber walls 202, and chamber bottom 203 define the processing volume 253. In one embodiment, a slit valve 254 is formed through the chamber walls 202. The slit valve 254 is configured to transfer substrates to and from the processing volume 253. In one embodiment, the processing chamber 200 further comprises a gas source 252 configured to provide one or more processing gases to the processing volume 253. The processing chamber 200 also comprises a vacuum system 251 configured to pump the processing volume 253.

The susceptor support 260 is disposed in the processing volume 253 and configured to support and position the susceptor 204 and a substrate 205. One or more ports 208 are formed in susceptor support 260. The one or more ports 208 are connected to a fluid delivery system 250. In one embodiment, the one or more ports 208 comprise one or more supporting ports configured to elevate the susceptor 204 along with the substrate 205. In another embodiment, the one or more ports 208 also comprise one or more rotating ports configured to rotate the susceptor 204 and the substrate 205 while the susceptor 204 is in an elevated position. In yet another embodiment, rotating of the susceptor 204 may be performed by susceptor edge rollers 206. Embodiments of the one or more ports 208 are further described above in FIGS. 2A and 2B.

In one embodiment, the chamber bottom 203 comprises a quartz window configured to allow radiant energy to pass through and to heat the susceptor 204 and the substrate 205. The susceptor support 260 may have a shape of a ring to expose the quartz window.

In one embodiment, the processing chamber 200 further comprises a lifting mechanism 261 configured to move the susceptor support 260 vertically.

In one embodiment, the processing chamber 200 comprises the susceptor edge rollers 206. In one embodiment, the susceptor edge rollers 206 are configured to limit the susceptor 204 within a region, particularly when the susceptor 204 is lifted and rotated by the one or more ports 208. In another embodiment, the susceptor edge rollers 206 are configured to rotate the susceptor 204 about a central axis of the susceptor while the susceptor 204 is lifted by the one or more ports 208. In one embodiment, the susceptor positioning system 206 may be extended to the chamber bottom 203. In another embodiment, the susceptor edge rollers 206 may be extended from the susceptor support 260.

The processing chamber 200 further comprises three or more substrate supporting pins 207 configured to receive and support the substrate 205. In one embodiment, the three or more substrate supporting pins 207 may be retractable when not supporting a substrate.

In one embodiment, the processing chamber 200 further comprises a sensor assembly 256 configured to detect positions and orientations of the susceptor 204. The sensor assembly 256 may be connected to a controller 209. The controller 209 is further connected to the fluid delivery system 250. The controller 209 receives information from the sensor assembly 256 and obtains position and motion of the susceptor 204. The controller 209 can send control signals to the fluid delivery system 250, thus, controlling the one or more ports 208 to adjust position and motion of the susceptor 204 accordingly.

FIG. 4A depicts the processing chamber 200 in a substrate transferring position. The susceptor 204 rests on the susceptor support 260. The three or more substrate supporting pins 207 extends through the susceptor 204 forming a supporting surface for the substrate 205. The three or more substrate supporting pins 107 are in position to receive the substrate 205 from a substrate handler (not shown) delivering the substrate 205 through the slit valve 254 or to transfer the substrate 205 to the substrate handler.

FIG. 4B depicts the processing chamber 200 in a lower substrate processing position. The susceptor support 260 is in a lowered position. In one embodiment, the one or ports 208 provide flow of fluid to lift the susceptor 204 from the resting position, and the lifted susceptor 204 picks up the substrate 205 from the three or more substrate supporting pins 207.

FIG. 4C depicts the processing chamber 200 in a higher substrate processing position. The susceptor support 260 is lifted by the lifting mechanism 261. The processing chamber 200 can process the substrate 205 in a position anywhere between the lower position shown in FIG. 2B and the higher position shown in FIG. 4C, thus providing flexibility in processing.

Figure 5A:
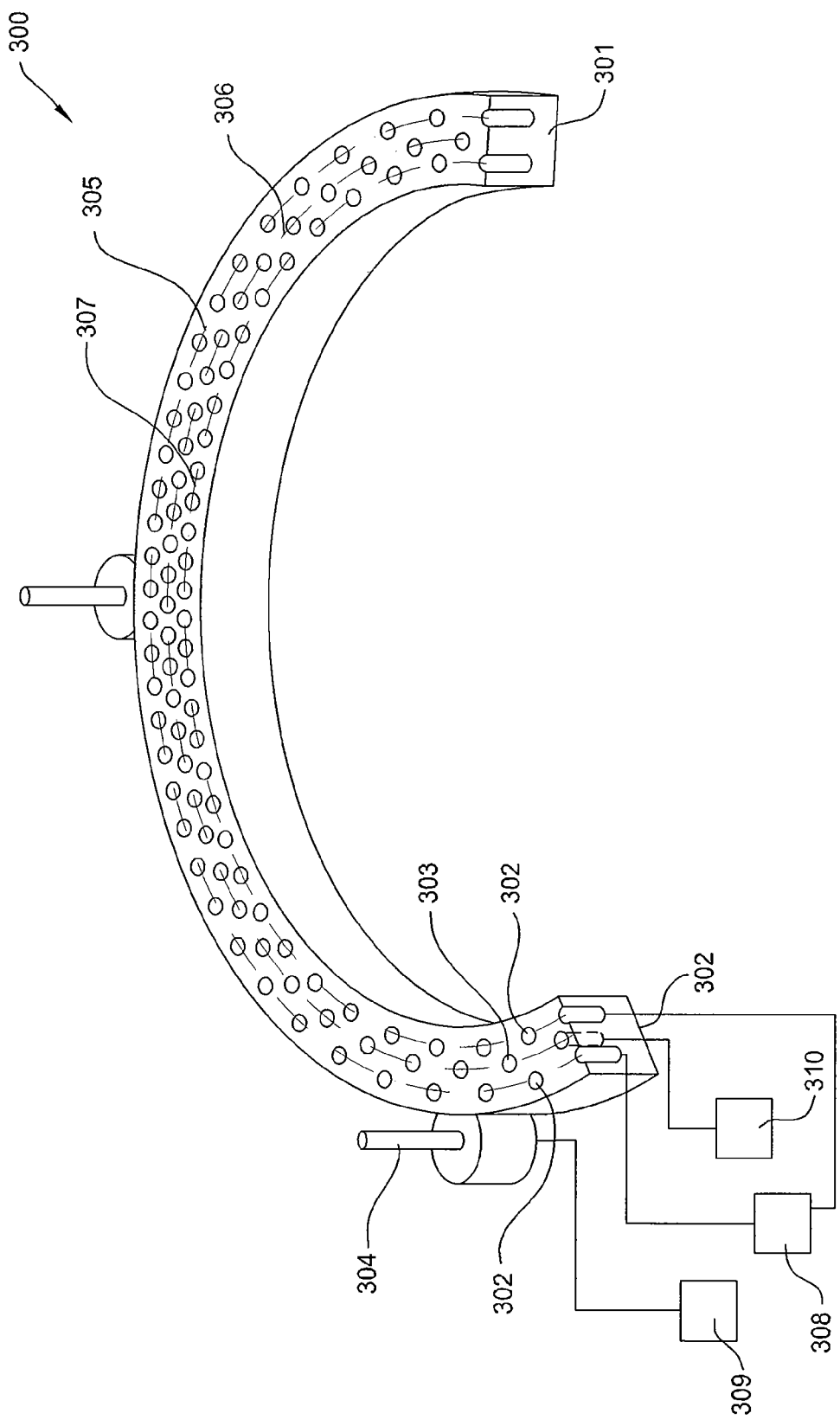
FIG. 5A schematically illustrates a susceptor support in accordance with one embodiment of the present invention.

FIG. 5A schematically illustrates a susceptor support 300 in accordance with one embodiment of the present invention. The susceptor support 300 comprises a body 301, on which a plurality of air bearing edge rollers 304 may be extended. In one embodiment, the rollers 304 may be connected to a fluid source 309. In one embodiment, the body 301 is an annular ring and may include a plurality of apertures 303 for flowing gas therethrough to elevate a susceptor and a substrate disposed thereon. The plurality of apertures 303 may be connected to a fluid source 310. Apertures 302 for providing vacuum between a susceptor and the body 301 may also be present. The plurality of apertures 302 may be connected to a vacuum pump 308.

In one embodiment, the plurality of apertures 302, 303 may be arranged in a concentric circular fashion so that three aperture circles are in the body 301. In one embodiment, an outer circle of apertures 305 may be adapted to provide vacuum, a middle circle of apertures 306 may be adapted to provide a gas, and an inner circle of apertures 307 may provide vacuum. Any number of such aperture circles and configurations of vacuum and gas adapted apertures are contemplated. Apertures 302, 303 may have a diameter of between about 1/2000 of an inch and about 1/16 of an inch, preferably between about 1/1000 of an inch and about 1/32 of an inch.

The body 301 may be fabricated from a suitable material that reduces potential scratching, chemical or physical contamination and/or marring of the susceptor, for example, stainless steel, aluminum, metal alloys, ceramic or a high temperature polymer.

Figure 5B:
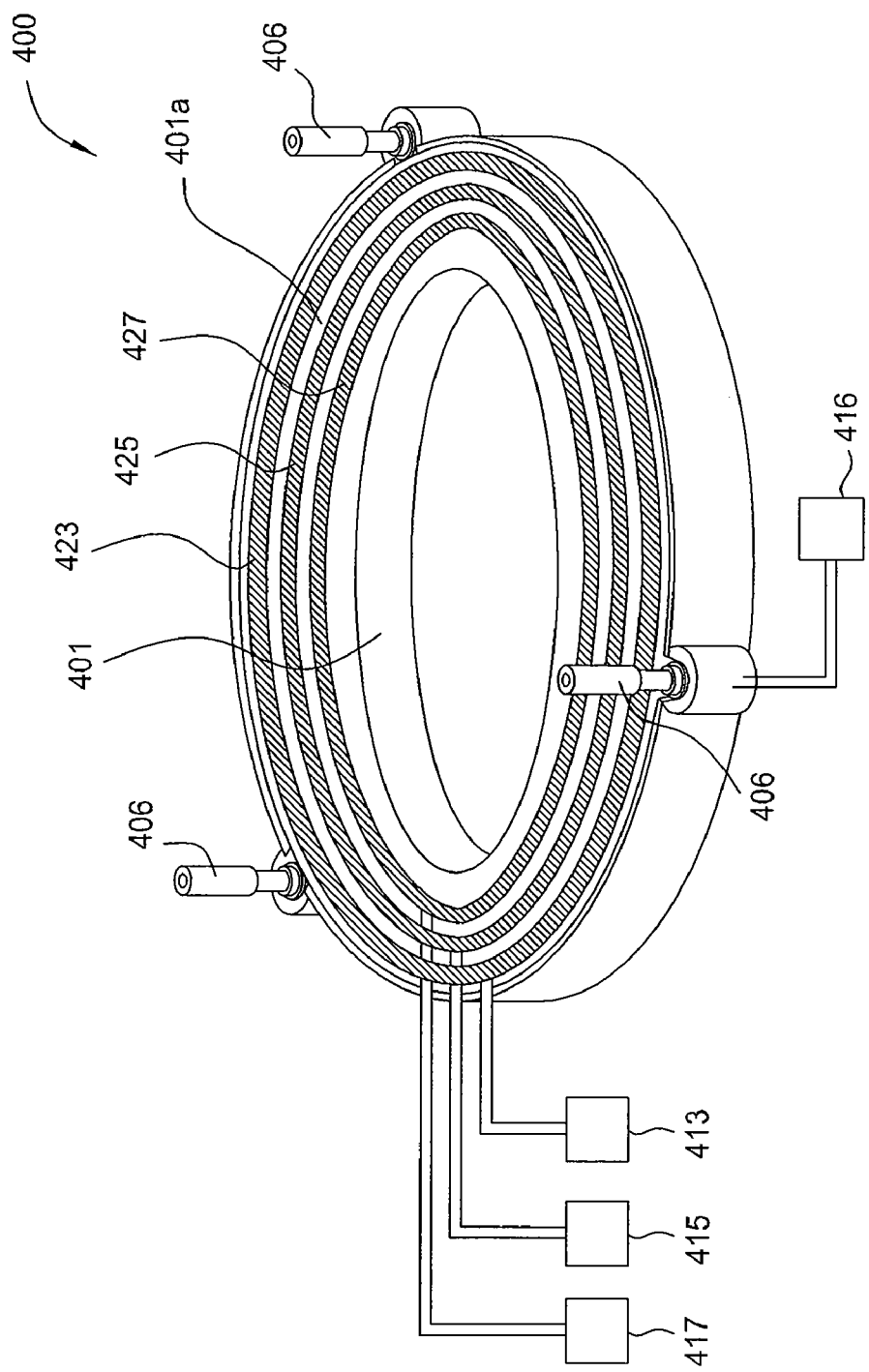
FIG. 5B schematically illustrates a susceptor support in accordance with another embodiment of the present invention.
Figure 5C:
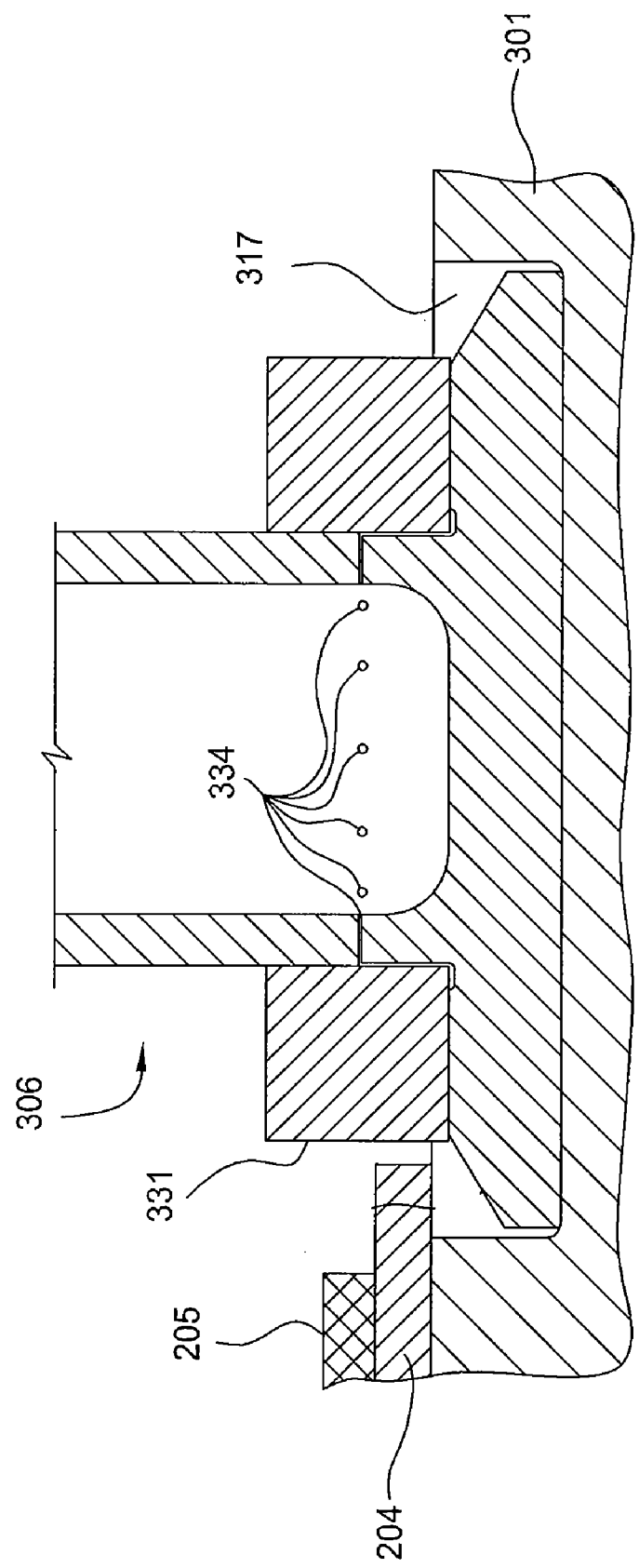
FIG. 5C schematically illustrates an edge roller in accordance with one embodiment of the present invention.

FIG. 5C depicts an embodiment of the edge rollers 306. The edge roller 306 is adapted to position and rotate the susceptor 204 and the substrate 205. The edge rollers 306 may rest on the body 301 in grooves 317 and may be fabricated from a material that reduces potential scratching, chemical or physical contamination and/or marring of the susceptor and substrate surfaces, for example, a high temperature polymer, silicon carbide, graphite, or aluminum.

A floating sleeve 331 circumscribes each edge roller 306. The floating sleeve 331 is configured to contact the susceptor 204 and to rotate the susceptor 204. The floating sleeve 331 may have an outer diameter between about 5 mm and about 150 mm. In one embodiment, the floating sleeve 331 may have an outer diameter of between about 20 mm and about 50 mm. In one embodiment, the floating sleeve 331 may be made from low mass density materials, such as sapphire or quartz. Gas flow channels 334 may be evenly spaced and adapted to flow gas to lift floating sleeve 331, so that floating sleeve 331 may rotate freely with minimal friction.

FIG. 5B schematically illustrates a susceptor support 400 in accordance with another embodiment of the present invention. The susceptor support 400 comprises a body 401, on which a plurality of edge rollers 406 are positioned. In one embodiment, the plurality of edge rollers 406 are connected to a fluid source 416. In one embodiment, the body 401 has a ring shape and has one or more annular grooves formed on an upper surface 401a.

In one embodiment, the body 401 has an annular groove 425 for flowing gas therethrough to elevate a susceptor, and annular grooves 423 and 427 for evacuating. In one embodiment, the grooves 423, 425, 427 may be arranged in a concentric circular fashion. In one embodiment, the outer annular groove 423 may be connected to a vacuum pump 413 and adapted to provide an evacuated region, the middle annular groove 425 may be connected to a fluid source 415 and adapted to provide fluid flow, and the inner annular groove 427 may be connected to an vacuum pump 417 and adopted to provide an evacuated region. Any number of grooves and configurations of vacuum and gas adapted grooves are contemplated.

The annular grooves 423, 425, 427 are configured to elevate a susceptor and the plurality of edge rollers 406 are configured to rotate the susceptor while the susceptor is elevated. In one embodiment, the edge rollers 406 may be driven by air flow and have a structure similar to the edge roller 306 of FIG. 5C.

Referring back to FIG. 4A, the processing chamber 200 can be adapted for a variety of processing chambers by arranging different gas distribution assemblies and/or heating sources. The processing chamber 200 may be used in chambers, such as chemical vapor deposition chamber, rapid thermal processing chamber, epitaxial processing chambers, and any other chambers where uniformity of processing gas and/or uniformity of heating are desired.

Figure 6A:
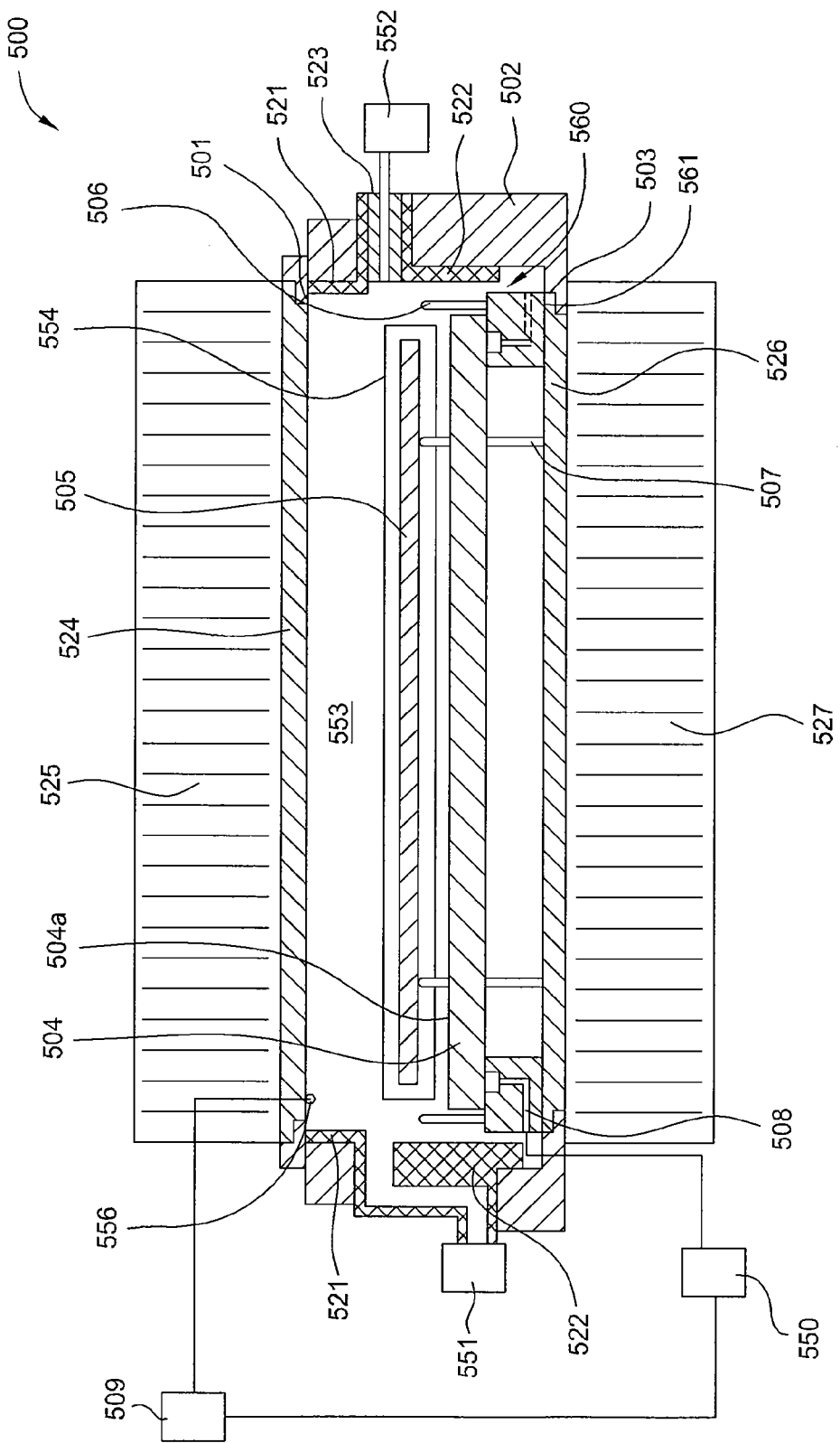
FIGS. 6A-6B schematically illustrate an epitaxial processing chamber in accordance with one embodiment of the present invention.
Figure 6B:
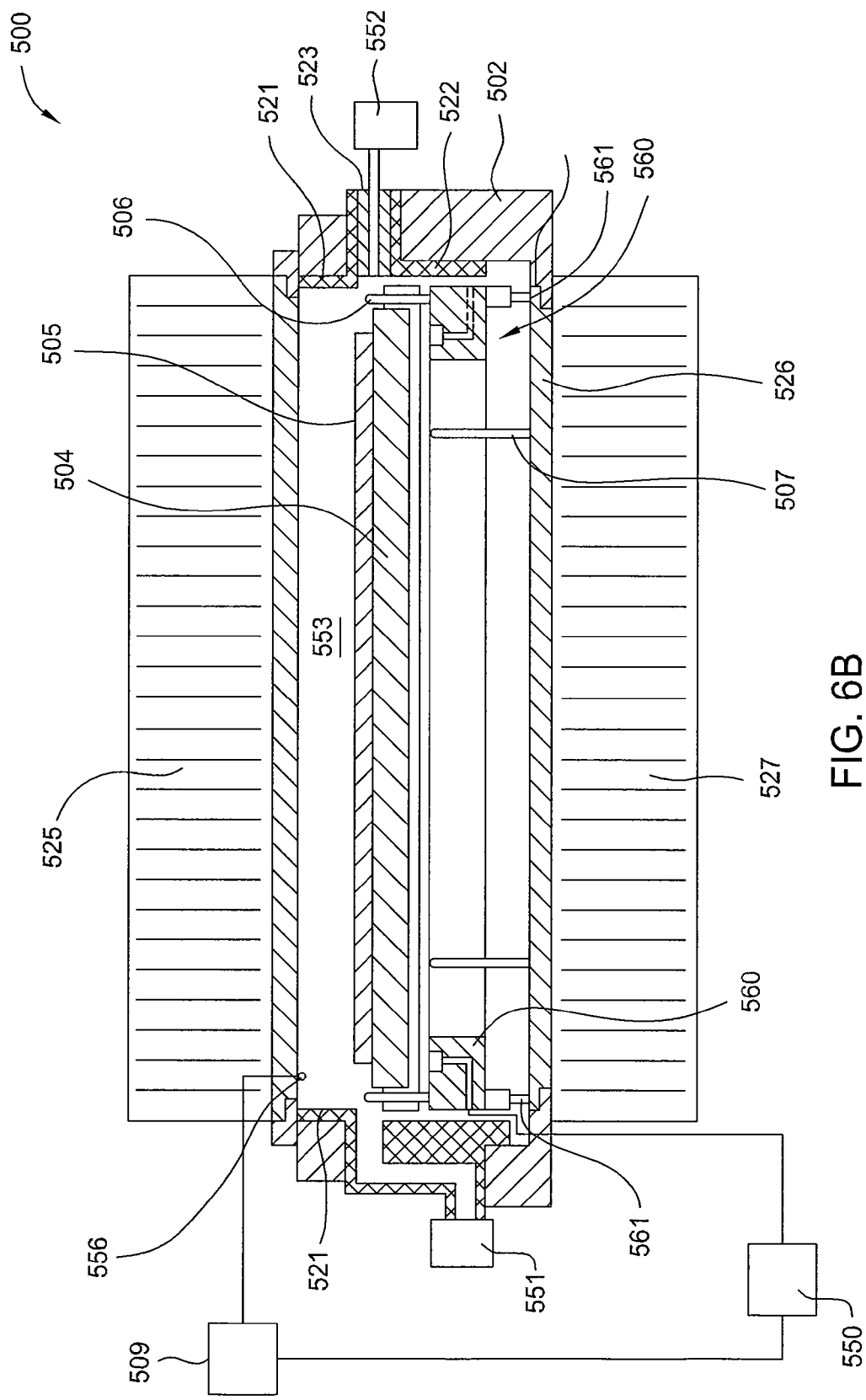

FIGS. 6A-6B schematically illustrate an epitaxial processing chamber 500 in accordance with one embodiment of the present invention. An epitaxial processing chamber is generally used to form a thin film over a substrate by epitaxy growth. It is generally necessary to heat the substrate to a high temperature during epitaxial processing. As critical dimension of the devices become smaller, it is increasingly critical to heat the entire substrate uniformly during epitaxial processing. The epitaxial processing chamber 500 comprises a susceptor support 560 configured to facilitate uniform heating of the substrate during processing.

The epitaxial processing chamber 500 comprises a chamber lid 501, chamber walls 502, and a chamber bottom 503. The chamber lid 501, chamber walls 502, and chamber bottom 503 define a processing volume 553. In one embodiment, a slit valve 554 is formed through the chamber walls 502. The slit valve 554 is configured to transfer substrates to and from the processing volume 553.

The epitaxial processing chamber 500 further comprises an upper liner 521 and a lower liner 522 disposed along the side walls 502 inside the processing volume 553. A gas source 552 configured to provide one or more processing gases is fluidly connected to the processing volume 553 via an inject baffle 523 disposed between the upper liner 521 and the lower liner 523. The epitaxial processing chamber 500 further comprises a vacuum system 551 configured to pump the processing volume 553. In one embodiment, the inject baffle 523 is positioned to injecting processing gas at an elevation different from the slit valve 554 to reduce non-uniformity due to the non symmetry caused by the slit valve 554.

In one embodiment, the chamber lid 501 comprises a quartz window 524. A radiant energy source 525 is disposed over the chamber lid 501. The quartz window 524 allows radiant energy from the radiant energy source 525 to enter the processing volume 553. The radiant energy from the radiant energy source 525 may be used to heat a substrate 505 being processed and/or to break the processing chemicals in the processing volume 553. The radiant energy source 525 may be infrared lamp assemblies, UV lamp assemblies, laser source, or any suitable energy source.

In one embodiment, the chamber bottom 503 comprises a quartz window 526. A radiant energy source 527 is disposed below the chamber bottom 503 and configured to direct radiant energy to the processing volume 553 through the quartz window 526. The radiant energy source 527 may be infrared lamp assemblies, UV lamp assemblies, laser source, or any suitable energy source.

The epitaxial processing chamber 500 further comprises a susceptor 504 disposed in the processing volume 553. The susceptor 504 has a substrate receiving surface 504a configured to receive a substrate 505 thereon.

The susceptor support 560 is disposed in the processing volume 553 and configured to support and position the susceptor 504 and the substrate 505. One or more ports 508 are formed in susceptor support 560. The one or more ports 508 are connected to a fluid delivery system 550. In one embodiment, the one or more ports 508 comprise one or more supporting ports configured to elevate the susceptor 504 along with the substrate 505. In another embodiment, the one or more ports 508 also comprise one or more rotating ports configured to rotate the susceptor 504 and the substrate 505 while the susceptor 504 is in an elevated position. In yet another embodiment, rotating of the susceptor 504 may be performed by susceptor edge rollers 506. The susceptor support 560 may have a shape of a ring to expose the quartz window 526 and allow the susceptor 504 to be heated by the radiant energy source 527. In one embodiment, the epitaxial processing chamber 500 further comprises a lifting mechanism 561 configured to move the susceptor support 560 vertically. The susceptor support 560 may be similar to the susceptor supports 300, 400 described in FIGS. 5A and 5B.

In embodiment, the epitaxial processing chamber 500 comprises the susceptor edge rollers 506. In one embodiment, the susceptor edge rollers 506 are configured to limit the susceptor 504 within a region, particularly when the susceptor 504 is lifted and rotated by the one or more ports 508. In another embodiment, the susceptor edge rollers 506 are configured to rotate the susceptor 504 about a central axis of the susceptor while the susceptor 504 is lifted by the one or more ports 508. In one embodiment, the susceptor positioning system 506 may be extended to the chamber bottom 503. In another embodiment, the susceptor edge rollers 506 may be extended from the susceptor support 560. The susceptor edge rollers 506 may be similar to the edge rollers 306 described in FIG. 5C.

The epitaxial processing chamber 500 further comprises three or more substrate supporting pins 507 configured to receive and support the substrate 505. In one embodiment, the three or more substrate supporting pins 507 may be retractable when not supporting a substrate.

In one embodiment, the epitaxial processing chamber 500 further comprises a sensor assembly 556 configured to detect positions and orientations of the susceptor 504. The sensor assembly 556 may be connected to a controller 509. The controller 509 is further connected to the fluid delivery system 550. The controller 509 receives information from the sensor assembly 556 and obtains position and motion of the susceptor 504. The controller 509 can send control signals to the fluid delivery system 550, thus, controlling the one or more ports 208 to adjust position and motion of the susceptor 504 accordingly.

FIG. 6A depicts the epitaxial processing chamber 500 in a substrate transferring position. The susceptor 504 rests on the susceptor support 560. The three or more substrate supporting pins 507 extends through the susceptor 504 forming a supporting surface for the substrate 505. The three or more substrate supporting pins 507 are in position to receive the substrate 505 from a substrate handler (not shown) delivering the substrate 505 through the slit valve 554 or to transfer the substrate 505 to the substrate handler.

FIG. 6B depicts the epitaxial processing chamber 500 in a substrate processing position. The susceptor support 560 is a raised position. In one embodiment, the one or ports 508 provide flow of fluid to lift the susceptor 504 from the resting position, and the lifted susceptor 504 picks up the substrate 505 from the three or more substrate supporting pins 507.

Figure 7:
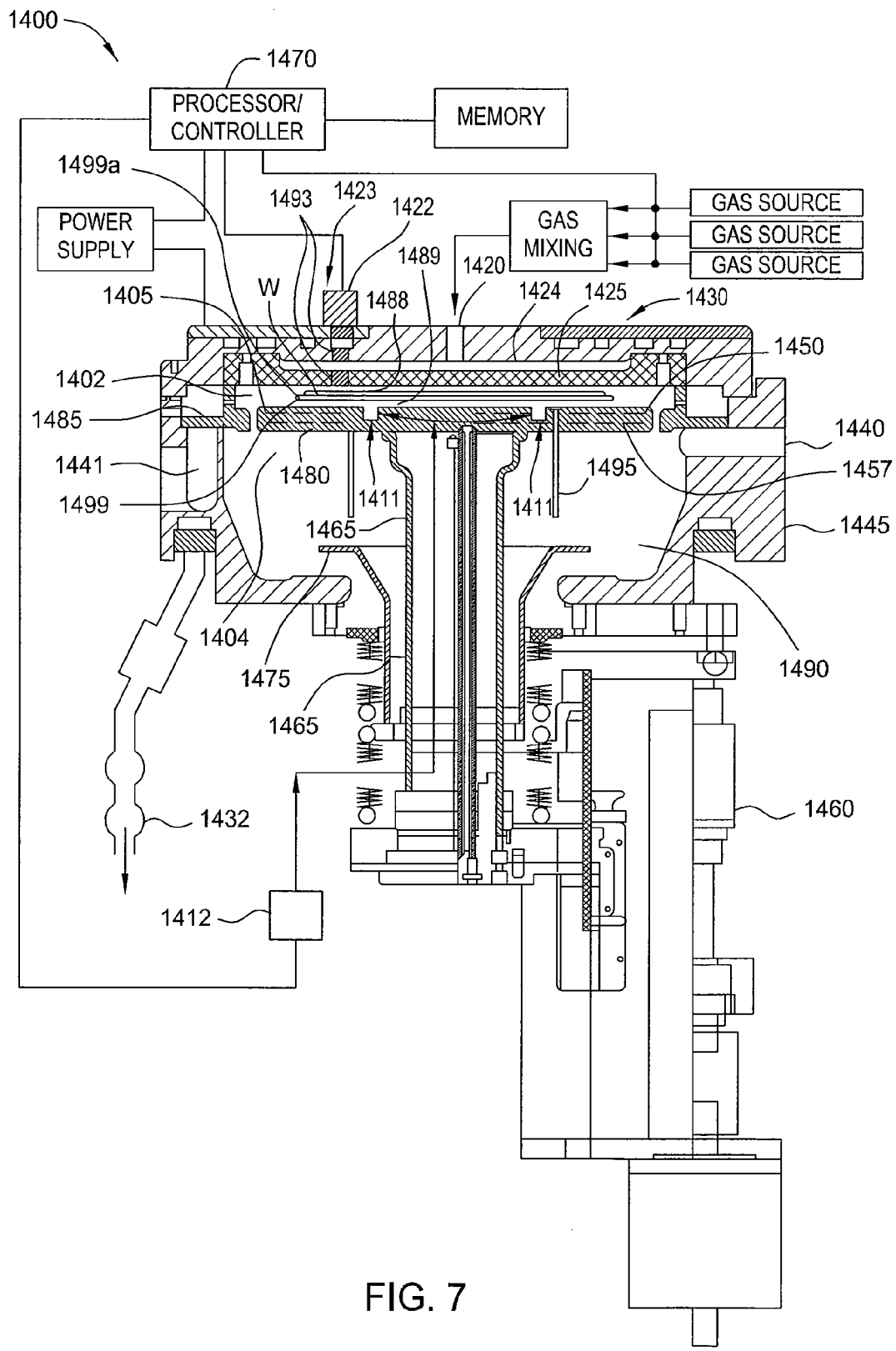
FIG. 7 schematically illustrates a plasma enhanced chemical vapor deposition chamber in accordance with one embodiment of the present invention.

FIG. 7 schematically illustrates a plasma enhanced chemical vapor deposition chamber 1400 in accordance with one embodiment of the present invention. In one particular embodiment, the apparatus may be a Low pressure CVD (LPCVD) chamber. The LPCVD chamber 1400 illustrated is generally constructed of materials that can maintain a chamber pressure between about 200 Torr and about 350 Torr and a deposition chamber temperature between about 600° C. and about 800° C. For the purpose of illustration, the LPCVD chamber 1400 may have a chamber volume of about 5-6 liters. FIG. 7 illustrates the inside of a chamber body 1445 in a "substrate-process" position. In one embodiment, the LPCVD chamber 1400 is adapted to process a single substrate, and may be sized to accommodate a substrate having a diameter greater than about 200 mm.

The chamber body 1445 defines a reaction chamber 1490 in which the thermal decomposition of a process gas or gases takes place to form a CVD deposited film on a substrate W, such as a polysilicon film. In one embodiment, the LPCVD chamber 1400 may be a "cold-wall" reaction chamber that is formed from an aluminum material and has cooling channels formed therein. Resident in the reaction chamber 1490 is a susceptor support 1405 that may contain a resistive heater 1480 that is supported by a shaft 1465. The susceptor support 1405 is configured to support a susceptor 1499 by fluid flow. As shown in FIG. 7, a gap 1489 is formed between the susceptor 1499 and the susceptor support 1405 during processing. The susceptor 1499 has a substrate receiving surface 1499a sufficient to receive a substrate, such as the substrate W.

FIG. 7 also illustrates a cross-sectional view of a portion of the heater 1480, including a cross-section of the body of the susceptor support 1405 and a cross-section of a shaft 1465. As shown, the body of the susceptor support 1405 may have two heating elements formed therein, such as a first heating element 1450 and a second heating element 1457 that compatible with the material from which the susceptor support 1405 is made. In an alternative embodiment, the LPCVD chamber 1400 may include lamps instead of the resistive type of heating elements 1450 and 1457.

The LPCVD chamber 1400 allows for a precise control of the temperature and pressure of the deposition environment. The passage of a process gas through a blocker plate 1424 and a perforated face plate 1425 provides the advantage of a uniform gas distribution towards the susceptor 1499 and the substrate W. Suitable materials for the reaction chamber 1490 should be compatible with the process gases and other chemicals, such as cleaning chemicals (e.g., nitrogen trifluoride, $NF_3$) that may be introduced into the reaction chamber 1490.

The exposed surfaces of the heater 1480 may be comprised of a variety of materials provided that the materials are compatible with the process gases. For example, the susceptor support 1405 and the shaft 1465 of the heater 1480 may be comprised of similar aluminum nitride material. In one embodiment, the susceptor support 1405 of the heater 1480 may be coupled to the shaft 1465 by diffusion bonding or brazing, because this type of coupling may withstand the environment of the reaction chamber 1490.

During processing a process gas may enter the otherwise sealed reaction chamber 1490 through a gas distribution port 1420 in a top surface of the chamber lid 1430 of the chamber body 1445. The process gas may then go through the blocker plate 1424 to distribute the gas about an area consistent with the surface area of the substrate W via the susceptor 1499. Thereafter, the process gas may be distributed through the perforated face plate 1425 located above the heater 1480 and coupled to the chamber lid 1430 inside the reaction chamber 1490. In one embodiment, the combination of the blocker plate 1424 with the face plate 1425 creates a uniform distribution of process gas near a top surface of the substrate W.

As illustrated in FIG. 7, the substrate W and the susceptor 1499 may be placed in the reaction chamber 1490 on the susceptor support 1405 of the heater 1480 through an entry port 1440 in a side portion of the chamber body 1445. To accommodate a substrate for processing, the heater 1480 is lowered so that the surface of the susceptor support 1405 is below the entry port 1440.

In one embodiment, as shown in FIG. 7, the susceptor support 1405 contains the components found in the susceptor support assembly 108 discussed above. In this configuration, the susceptor support 1405 is adapted to support, position, and/or rotate the susceptor 1499 along with the substrate W disposed thereon.

The heater 1480 contains a plurality of ports 1411 that are in communication with the fluid delivery system 1412, which combined with the sensing assembly 1423 and controller 1470 can position and/or rotate the substrate during processing.

In one embodiment, the substrate is rotated at a speed between about 100 and about 3000 rpm using the plurality of ports 1411 during the processing steps performed on the substrate. By shielding the substrate W with the susceptor 1499 and rotating the substrate even heat distribution may be obtained.

Also, since the susceptor support 1405 components and other related components do not need to be rotated the hardware complexity and chamber reliability is greatly increased. The complexity and reliability improvement over configurations that require the susceptor support 1405, or other related components, to be rotated is especially true for configurations where the process is performed in a high temperature (e.g., >500° C.) vacuum environment where the susceptor support 1405 also needs to be moved vertically.

In one embodiment, the sensing assembly 1423, which is positioned and within the chamber lid 1430, is positioned and configured to monitor the position of the susceptor 1499 and/or the substrate W. In one embodiment, the sensing assembly 1423 contains a sensor 1422 that is positioned to view the edge of the susceptor 1499 over the susceptor support 1405 so that a system controller 1470 can control the position and movement of the substrate by use of fluid delivered through the ports 1411. In one embodiment, one or more windows 1493 are sealably mounted to components in the chamber lid 1430, such as blocker plate 1424 and a perforated face plate 1425, to provide an optical path to allow one or more sensors (e.g., retroreflective type sensor) to view and monitor the motion of the substrate.

In one embodiment, the substrate W may be loaded into the reaction chamber 1490 by way of, for example, a transfer blade of a robotic transfer device (not shown) onto the top surface of the susceptor 1499. Once the substrate W is loaded, the entry port 1440 is sealed and the heater 1480 is advanced in an upward direction toward the face plate 1425 by a lifter assembly 1460 that may include, for example, a stepper motor. Fluid flow may be provided to the ports 1411 lifting the susceptor 1499 from the susceptor support 1405 and rotating the susceptor 1499 at the same time. In the substrate-process position of FIG. 7, the reaction chamber 1490 is divided into two zones, a first zone 1402 above the top surface of the susceptor support 1405, and a second zone 1404 below the bottom surface of the susceptor support 1405.

With the substrate W disposed within the reaction chamber 1490, the first zone 1402 includes an area 1488 above the substrate W where a film is formed on the top surface of the substrate W (e.g., polysilicon film on the substrate surface facing the perforated face plate 1425).

The process gas, which flows into the reaction chamber 1490 under the control of a gas panel, may be thermally decomposed to form a film on the substrate. At the same time, an inert bottom-purge gas, e.g., nitrogen, may be introduced into the second zone 1404 to inhibit film formation in that zone. In one embodiment, a baratron pressure regulator(s) maintains the pressure in the first zone 1402 at a level between about 200 Torr to about 350 Torr and a temperature between about 600° C. and 800° C. for the deposition of a polysilicon film on the substrate W.

Residual process gas may be pumped out of the reaction chamber 1490 through a pumping plate 1485 to a collection vessel at a side of the chamber body 1445. A pump 1432 disposed outside the reaction chamber 1490 may provide vacuum pressure within a pumping channel 1441 to draw both the process and purge gases out of the reaction chamber 1490 to the pump 1432. Preferably, a controller or processor (not shown) receives signals from the pressure sensor(s) to allow the chamber pressure to be adjusted and maintained a desired pressure by controlling the pump 1432 flow rate.

Once the processing of the substrate W is complete, the reaction chamber 1490 may be purged, for example, with an inert gas, such as nitrogen. After processing and purging, rotation to the susceptor 1499 may be stopped after aligning the susceptor 1499 with the lifting pins 1495. The heater 1480 is then lowered by the lifter assembly 1460. As the heater 1480 is moved, lift pins 1495, which extend through openings in a surface of the susceptor support 1405, contact a lift plate 1475 positioned at the base of the reaction chamber 1490. As the heater 1480 continues to move downward driven by the lifter assembly 1460, the lift pins 1495 remain stationary and ultimately extend above the susceptor support 1405 to separate the processed substrate W from the surface of the susceptor 1499. The top surface 1499a of the susceptor 1499 is thereby moved to a position below the entry port 1440.

Once a processed substrate W is separated from the surface of the susceptor 1499, the transfer blade of a robotic mechanism may be moved through the entry port 1440 beneath the top ends of the lift pins 1495 that supports the substrate W. Next, the lifter assembly 1460 further moves downward the heater 1480 and the lift plate 1475 to a "substrate load" position. The processed substrate W may then be retrieved through the entry port 1440 and transferred to the next processing stage. A second substrate (not shown) may then be loaded into the reaction chamber 1490 for processing. The steps described above then may be reversely performed to bring the new substrate W into a process position.

While the foregoing is directed to the preferred embodiment of the present invention, other and further embodiments of the invention may be devised without departing from the basic scope thereof. The scope of the invention is determined by the claims that follow.

What is claimed is:

1. A method for processing a substrate, comprising:
   positioning the substrate on a substrate receiving surface of a susceptor,
      wherein positioning the substrate on the susceptor comprises:
         extending three or more supporting pins through openings formed through the susceptor;
         receiving the substrate using the three or more substrate supporting pins;
         and transferring the substrate to the susceptor by lowering the three or more substrate supporting pins;
      and wherein
         the susceptor is disposed over a support assembly of a processing chamber, the support assembly comprises one or more supporting ports, one or more rotating ports, and each of the supporting ports and rotating ports is adapted to receive a fluid from a flow controller;
   raising the substrate to a processing position by delivering flow of fluid to the one or more supporting ports to float the susceptor and the substrate;
   rotating the susceptor and the substrate by delivering flow of fluid to the one or more rotating ports;
   aligning the openings in the susceptor with the three or more supporting pins by controlling the flow of fluid to the one or more rotating ports; and
   ceasing the flow of fluid to the one or more rotating ports to stop rotating the susceptor.

2. The method of claim 1, further comprising heating the susceptor from a direction opposing the substrate receiving surface.

3. The method of claim 2, wherein heating the susceptor comprises transmitting radiant energy through a quartz window of the processing chamber.

4. The method of claim 3, wherein the one or more supporting ports and the one or more rotating ports are formed in the quartz window.

5. The method of claim 1, further comprising:
   lowering the susceptor by controlling the flow of fluid to the one or more supporting ports; and
   transferring the substrate from the susceptor to the three or more substrate supporting pins by extending the three or more supporting pins through openings formed through the susceptor.

6. The method of claim 1, wherein raising the substrate to a processing position further comprises lifting the support assembly.

* * * * *